(12) United States Patent
Zhang et al.

(10) Patent No.: US 10,636,836 B2
(45) Date of Patent: Apr. 28, 2020

(54) SEMICONDUCTOR LIGHT-EMITTING DEVICE AND MANUFACTURING METHOD THEREFOR

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: Enkris Semiconductor, Inc., Suzhou (CN)

( * ) Notice: Subject to any disclaimer, the term of this patent is extended or adjusted under 35 U.S.C. 154(b) by 0 days.

(21) Appl. No.: 16/148,989

(22) Filed: Oct. 1, 2018

(65) Prior Publication Data
US 2019/0035845 A1 Jan. 31, 2019

Related U.S. Application Data

(63) Continuation of application No. PCT/CN2017/078474, filed on Mar. 28, 2017.

(30) Foreign Application Priority Data

Mar. 29, 2016 (CN) .......................... 2016 1 0187812

(51) Int. Cl.
| | |
|---|---|
| H01L 33/36 | (2010.01) |
| H01L 27/15 | (2006.01) |
| H01L 33/00 | (2010.01) |
| H01L 33/06 | (2010.01) |
| H01L 33/14 | (2010.01) |

(Continued)

(52) U.S. Cl.
CPC ........ *H01L 27/153* (2013.01); *H01L 33/0075* (2013.01); *H01L 33/06* (2013.01); *H01L 33/14* (2013.01); *H01L 33/24* (2013.01); *H01L 33/32* (2013.01); *H01L 33/385* (2013.01); *H01L 33/44* (2013.01); *H01L 33/46* (2013.01); *H01L 33/22* (2013.01); *H01L 33/382* (2013.01);
(Continued)

(58) Field of Classification Search
CPC ........... H01L 27/156; H01L 33/38–387; H01L 33/62
See application file for complete search history.

(56) References Cited

U.S. PATENT DOCUMENTS

| | | | |
|---|---|---|---|
| 2010/0163887 A1* | 7/2010 | Kim ...................... | H01L 27/153 257/76 |
| 2011/0049537 A1* | 3/2011 | Lee ...................... | H01L 25/0753 257/88 |

(Continued)

*Primary Examiner* — Eric A. Ward
(74) *Attorney, Agent, or Firm* — Flener IP & Business Law; Zareefa B. Flener

(57) ABSTRACT

A semiconductor light-emitting device comprises: an insulating base, a current diffusion layer, light-emitting structure layers and an insulating layer. The current diffusion layer includes: a first electrode connecting part, a second electrode connecting part, N contact parts and N+1 flat parts. N+1 light-emitting structure layers are correspondingly disposed on the N+1 flat parts, and each of the N+1 light-emitting structure layers includes: a first semiconductor layer, an active layer and a second semiconductor layer sequentially stacked on a corresponding flat part. N grooves are formed on a side of the second semiconductor layer away from the active layer, depth of the N grooves is less than the thickness of the second semiconductor layer, and the N contact parts correspond to the N grooves.

15 Claims, 18 Drawing Sheets

(51) Int. Cl.
    *H01L 33/24*           (2010.01)
    *H01L 33/32*           (2010.01)
    *H01L 33/38*           (2010.01)
    *H01L 33/44*           (2010.01)
    *H01L 33/46*           (2010.01)
    *H01L 33/22*           (2010.01)
    *H01L 33/42*           (2010.01)

(52) U.S. Cl.
    CPC ...... *H01L 33/42* (2013.01); *H01L 2933/0016* (2013.01); *H01L 2933/0025* (2013.01)

(56) References Cited

U.S. PATENT DOCUMENTS

| | | | |
|---|---|---|---|
| 2013/0299867 A1* | 11/2013 | Illek | H01L 27/153 257/99 |
| 2014/0091330 A1* | 4/2014 | Chen | H01L 27/156 257/88 |
| 2017/0077366 A1* | 3/2017 | Kaga | H01L 33/62 |

* cited by examiner

SEMICONDUCTOR LIGHT-EMITTING DEVICE AND MANUFACTURING METHOD THEREFOR

CROSS-REFERENCE TO RELATED APPLICATIONS

The present application is a continuation of International Patent Application No. PCT/CN2017/078474 filed on Mar. 28, 2017, which claims priority to Chinese Patent Application No. 201610187812.0, filed on Mar. 29, 2016, all contents of which are incorporated by reference herein.

TECHNICAL FIELD

The present invention relates to the field of semiconductor, particularly to a semiconductor light-emitting device and a manufacturing method therefor.

BACKGROUND

In order to make a light-emitting diode (LED) work at a high voltage, one way currently used is to connect multiple LEDs in series and parallel, and the other way is to use a high-voltage LED (HV LED), which realizes the series and parallel connection of micro-crystals at the chip level. Compared to the series and parallel connection of multiple LEDs, the high-voltage LED realizing the series and parallel connection of micro-crystals at the chip level has the advantages of low encapsulation cost, low line loss and avoidance of consistency problems caused by wavelength, voltage and brightness span.

The existing high-voltage LED usually adopts a different-side vertical structure, in which two electrodes are on both sides of an LED epitaxial layer respectively. However, the front-end voltage of the package of the LED with the different-side vertical structure is relatively high, which easily leads to an excessively high temperature of the LED.

SUMMARY

Embodiments of the present invention are directed toward a semiconductor light-emitting device and a manufacturing method therefor, which are higher in integration density, smaller in size, and have less wiring and higher reliability than a high-voltage LED in which multiple semiconductor light-emitting devices are connected in series and in parallel.

A semiconductor light-emitting device according to the embodiments of the present invention comprises: an insulating base; a current diffusion layer arranged on the insulating base, wherein the current diffusion layer comprises: a first electrode connecting part, a second electrode connecting part, N contact parts between the first electrode connecting part and the second electrode connecting part, and N+1 flat parts between the first electrode connecting part and one contact part of the N contact parts which is adjacent to the first electrode connecting part, among the N contact parts, and between the second electrode connecting part and one contact part of the N contact parts which is adjacent to the second electrode connecting part, and N is a natural number; N+1 light-emitting structure layers correspondingly disposed on the N+1 flat parts, wherein each of the N+1 light-emitting structure layers comprises: a first semiconductor layer, an active layer and a second semiconductor layer sequentially stacked on a corresponding flat part, N grooves cooperating with the N contact parts are formed on a side of the second semiconductor layer away from the active layer, depth of the N grooves is less than the thickness of the second semiconductor layer, and the N contact parts correspond to the N grooves; and an insulating layer, wherein the insulating layer is disposed between the first electrode connecting part and a side of a light-emitting structure layer adjacent to the first electrode connecting part, and the first electrode connecting part is connected to the first semiconductor layer of the light-emitting structure layer disposed on the flat part through a flat part adjacent to the first electrode connecting part; the insulating layer is disposed between the second electrode connecting part and sides of the active layer and the first semiconductor layer of a light-emitting structure layer adjacent to the second electrode connecting part, and a side of a flat part adjacent to the second electrode connecting part, and a part of an end surface of the second electrode connecting part away from the insulating base is connected to the second semiconductor layer of the light-emitting structure layer adjacent to the second electrode connecting part; and the insulating layer is disposed between each of the contact parts and sides of the active layer and the first semiconductor layer of a light-emitting structure layer on a side of a corresponding contact part near the first electrode connecting part, and a side of a flat part on the side of the corresponding contact part near the first electrode connecting part, and between each of the contact parts and a side of a light-emitting structure layer on a side of a corresponding contact part near the second electrode connecting part, and an end surface of each of the contact parts away from the insulating base is connected to the second semiconductor layer of a light-emitting structure layer on a side of a corresponding contact part near the first electrode connecting part, and is connected to the first semiconductor layer on the flat part through a flat part on a side of a corresponding contact part near the second electrode connecting part.

In an embodiment of the present invention, the insulating base includes a first substrate, and a first bonding metal layer, a second bonding metal layer and an insulating base layer sequentially stacked on the first substrate, and the insulating base layer is disposed between the second bonding metal layer and the current diffusion layer.

In an embodiment of the present invention, the semiconductor light-emitting device further comprises: a first electrode formed on the first electrode connecting part and a second electrode formed on the second electrode connecting part.

In an embodiment of the present invention, the semiconductor light-emitting device further comprises: a reflective metal layer formed between the first semiconductor layer and the current diffusion layer.

In an embodiment of the present invention, the semiconductor light-emitting device further comprises: a conductive metal layer formed on parts connected to the second semiconductor layer of end surfaces of the N contact parts away from the insulating base.

In an embodiment of the present invention, a surface of the second semiconductor layer away from the first semiconductor layer has a pattern or a rough surface.

In an embodiment of the present invention, the semiconductor light-emitting device further comprises: a passivation layer formed on a surface of the second semiconductor layer away from the first semiconductor layer and bottoms of the N grooves.

In an embodiment of the present invention, the current diffusion layer further comprises at least one first tunnel electrode and at least one second tunnel electrode, the at least one first tunnel electrode is located between the first electrode connecting part and a contact part or between two adjacent contact parts, the at least one second tunnel electrode is located between a contact part and the second electrode connecting part, both sides of the at least one first tunnel electrode and the at least one second tunnel electrode are provided with the insulating layer, end surfaces of the at least one first tunnel electrode and the at least one second tunnel electrode near the insulating base are connected to the insulating base, and end surfaces of the at least one first tunnel electrode and the at least one second tunnel electrode away from the insulating base are electrically connected to the second semiconductor layer of corresponding light-emitting structure layers.

A manufacturing method for the semiconductor light-emitting device according to the embodiments of the present invention comprises: providing a semiconductor light-emitting base layer, wherein the semiconductor light-emitting base layer includes a first base, and a second semiconductor layer, an active layer and a first semiconductor layer sequentially formed on the first base; forming filling grooves respectively corresponding to a first electrode connecting part, a second electrode connecting part and N contact parts on a surface of the first semiconductor layer away from the first base, wherein the filling grooves extend from the surface of the first semiconductor layer away from the first base toward the second semiconductor layer, and the second semiconductor layer is exposed to the filling grooves; forming a first insulating layer on side walls of each of the filling grooves and a bottom wall of a filling groove corresponding to the first electrode connecting part; forming a current diffusion layer on a surface of the first semiconductor layer away from the second semiconductor layer, wherein the current diffusion layer includes the first electrode connecting part, the second electrode connecting part, N contact parts and flat parts connecting the first electrode connecting part, the second electrode connecting part and the N contact parts; etching flat parts of the current diffusion layer to form a second insulating layer, wherein the second insulating layer is formed between a flat part connected to the first electrode connecting part and a contact part, and between a flat part connected to a contact part and the second electrode connecting part; forming an insulating base on a surface of the current diffusion layer away from the second semiconductor layer; and removing the first base, and forming N grooves on a surface of the second semiconductor layer away from the first semiconductor layer, so that the N contact parts are correspondingly exposed to the N grooves.

In an embodiment of the present invention, before forming a current diffusion layer on a surface of the first semiconductor layer away from the second semiconductor layer, the method further comprises: performing a treatment for the first insulating layer to expose the surface of the first semiconductor layer away from the first base by the first insulating layer; forming a reflective metal layer on parts of the first semiconductor layer exposed by the first insulating layer; etching the first insulating layer on bottom walls of the filling grooves except a bottom wall of a filling groove corresponding to the first electrode connecting part, and retaining the first insulating layer on the bottom wall of the filling groove corresponding to the first electrode connecting part.

In an embodiment of the present invention, before forming a current diffusion layer on a surface of the first semiconductor layer away from the second semiconductor layer, the method further comprises: forming a conductive metal layer on etched parts of the first insulating layer.

In an embodiment of the present invention, after forming N grooves on a surface of the second semiconductor layer away from the first semiconductor layer, the method further comprises: roughening or patterning a surface of the second semiconductor layer away from the insulating base.

In an embodiment of the present invention, the method further comprises: forming a passivation layer on the surface of the second semiconductor layer away from the first semiconductor layer, bottoms of the grooves and exposed parts of the current diffusion layer.

In an embodiment of the present invention, after forming the passivation layer, the method further comprises: etching a part of the first insulating layer on the first electrode connecting part to form a first electrode, the first electrode being electrically connected to the first electrode connecting part, and etching a part of the conductive metal layer and the passivation layer on the second electrode connecting part to form a second electrode.

The semiconductor light-emitting device and the manufacturing method therefor according to the embodiments of the present invention are higher in integration density, smaller in size, and have less wiring and higher reliability than a high-voltage LED in which multiple semiconductor light-emitting devices are connected in series and in parallel.

To make the foregoing objects, features, and advantages of the embodiments of the present invention more obvious and easily understood, the following preferred embodiments will be taken as examples and described in detail with reference to the accompanying drawings.

BRIEF DESCRIPTION OF DRAWINGS

To more clearly describe the technical scheme of embodiments of the present invention, accompanying drawings used in the embodiments will be briefly described below. It should be understood that the following accompanying drawings merely illustrate some embodiments of the present invention and therefore should not be regarded as a limitation to the scope. Those skilled in the art can obtain other relevant drawings according to these accompanying drawings without involving any creative effort.

DETAILED DESCRIPTION

In the following detailed description, technical schemes in embodiments of the present invention will be clearly described with reference to the accompanying drawings in the embodiments. Apparently, the described embodiments are only a part of the embodiments of the present invention, but not all of the embodiments. Components of the embodiments of the present invention, described and illustrated in the accompanying drawings herein, may be arranged and designed in various different configurations. Therefore, the following detailed descriptions for the embodiments of the present invention provided in the accompanying drawings are not intended to limit the scope of the present invention, but merely indicate selected embodiments of the present invention. All other embodiments obtained by those skilled in the art based on the embodiments of the present invention without creative efforts will fall within the protection scope of the present invention.

It should be noted that similar reference symbols and letters denote similar items in the accompanying drawings, and therefore, once an item is defined in an accompanying drawing, it need not be further defined and interpreted in subsequent accompanying drawings.

Figure 1:
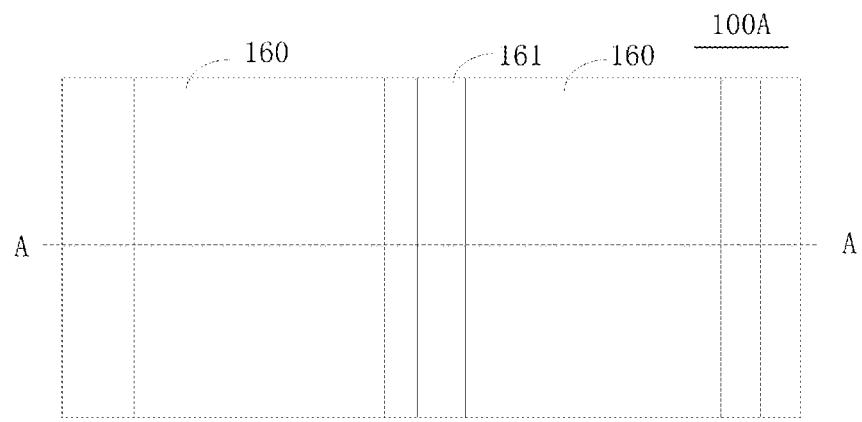
FIG. 1 is a top view illustrating a semiconductor light-emitting device according to a preferred embodiment of the present invention.
Figure 2:
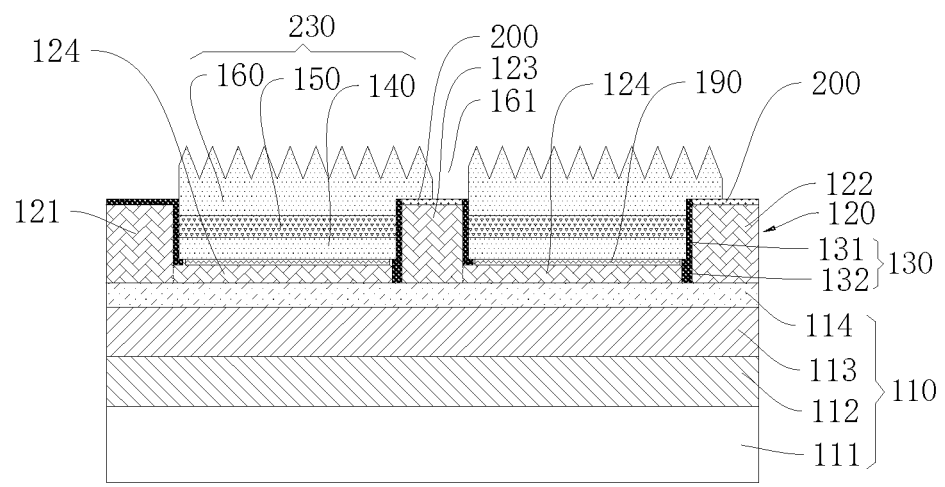
FIG. 2 is a cross-sectional diagram illustrating a semiconductor light-emitting device according to a preferred embodiment of the present invention along line A-A in FIG. 1.
Figure 3:
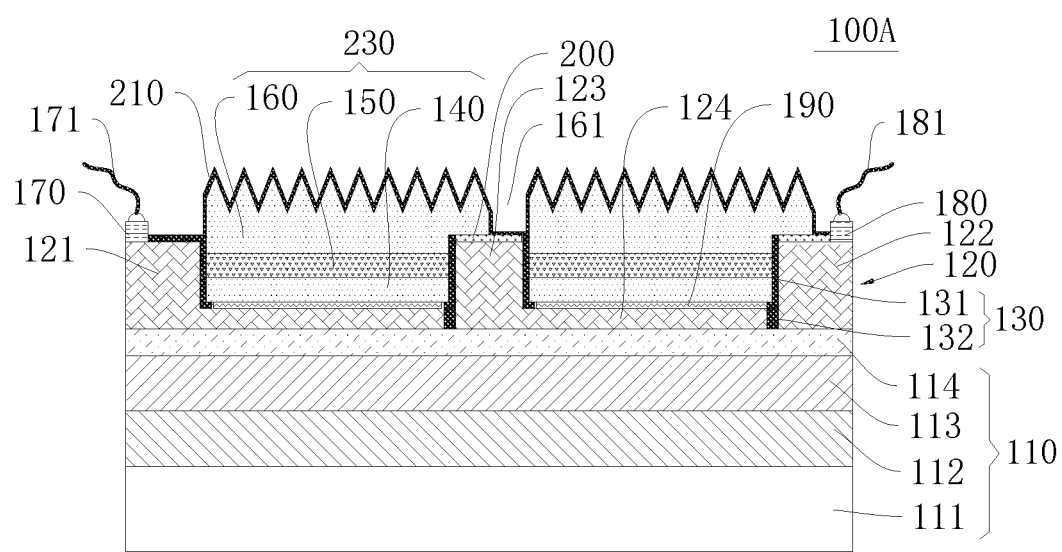
FIG. 3 is a cross-sectional diagram illustrating a semiconductor light-emitting device shown in FIG. 2 after adding a passivation layer and electrodes.

FIG. 1 is a top view illustrating a semiconductor light-emitting device according to a preferred embodiment of the present invention. FIG. 2 is a cross-sectional diagram illustrating a semiconductor light-emitting device according to a preferred embodiment of the present invention along line A-A in FIG. 1. FIG. 3 is a cross-sectional diagram illustrating a semiconductor light-emitting device shown in FIG. 2 after adding a passivation layer and electrodes.

Please refer to FIGS. 1-3, a semiconductor light-emitting device 100A according to a preferred embodiment of the present invention includes: an insulating base 110, and a current diffusion layer 120, an insulating layer 130, light-emitting structure layers 230, a first electrode 170 and a second electrode 180 disposed on the insulating base 110. In order to clearly illustrate the structure of the semiconductor light-emitting device in the embodiments of the present invention, the first electrode 170 and the second electrode 180 are not shown in FIGS. 1-2, and FIG. 3 shows a device structure with the first electrode 170 and the second electrode 180.

Specifically, the insulating base 110 may include a first substrate 111, and a first bonding metal layer 112, a second bonding metal layer 113 and an insulating base layer 114 which are sequentially stacked on the first substrate 111. Preferably, the first substrate 111 is a silicon substrate. Of course, the material of the first substrate 111 is not limited in the embodiments of the present invention, and it may be other materials, such as one or more of sapphire, silicon carbide and gallium arsenide. The material of the first bonding metal layer 112 and the second bonding metal layer 113 may be one of metals such as titanium, gold, nickel, tin and platinum, or an alloy or a polymetallic layer composed of various metals. The first bonding metal layer 112 and the second bonding metal layer 113 may be bonded to each other. The material of the insulating base layer 114 may be silicon dioxide, silicon nitride, or the like. Of course, the material of the insulating base layer 114 is not limited, and it may be others. The insulating base layer 114 is formed on a surface of the current diffusion layer 120 away from a first semiconductor layer 140, so that the current diffusion layer 120 and the second bonding metal layer 113 are disconnected.

The current diffusion layer 120 is directly arranged on the insulating base 110. The current diffusion layer 120 includes a first electrode connecting part 121, a second electrode connecting part 122, N contact parts 123 (N is a natural number, and in FIGS. 1-3, take one contact part 123 as an example), and N+1 flat parts 124 between the first electrode connecting part 121 and the contact part 123, and between the second electrode connecting part 122 and the contact part 123. It can be understood that the first electrode connecting part 121, the second electrode connecting part 122, the N contact parts 123 and the N+1 flat parts 124 are all parts of the current diffusion layer 120. Only for the convenience of description, the current diffusion layer 120 is divided into different regions: the first electrode connecting part 121, the second electrode connecting part 122, the N contact parts 123 and the N+1 flat parts 124 (segmented by dotted lines in FIG. 2).

Each flat part 124 is provided with a light-emitting structure layer 230, that is, the N+1 flat parts 124 correspond to N+1 light-emitting structure layers 230. Each light-emitting structure layer 230 includes the first semiconductor layer 140, an active layer 150 and a second semiconductor layer 160 sequentially stacked on a corresponding flat part 124. N grooves 161 cooperating with the N contact parts 123 are formed on a side of the second semiconductor layer 160 away from the active layer 150. The depth of the N grooves 161 is less than the thickness of the second semiconductor layer 160, and the N contact parts 123 correspond to the N grooves 161.

The second semiconductor layer 160 may have n-type conductivity, and the first semiconductor layer 140 may have p-type conductivity. Alternatively, the second semiconductor layer 160 may have p-type conductivity, and the first semiconductor layer 140 may have n-type conductivity.

The active layer 150 is located between the second semiconductor layer 160 and the first semiconductor layer 140. The active layer 150 may have, for example, a multiple quantum well structure. The multiple quantum well structure includes multiple quantum well layers and multiple quantum barrier layers formed between the quantum well layers. Preferably, the quantum well layers and the quantum barrier layers may be made of $Al_xIn_yGa_{1-x-y}N$ ($0 \leq x \leq 1$, $0 \leq y \leq 1$, $0 \leq x+y \leq 1$), but the energy bands of the quantum barrier layers are required to be wider than those of the quantum well layers. For example, if the light-emitting structure layer 230 is a gallium nitride-based light emitting diode, the second semiconductor layer 160 may be formed by GaN doped with n-type impurities, the first semiconductor layer 140 may be formed by GaN doped with p-type impurities, and the active layer 150 may be formed by alternately stacking the quantum well layers formed of $Al_xIn_yGa_{1-x-y}N$ ($0 \leq x \leq 1$, $0 \leq y \leq 1$, $0 \leq x+y \leq 1$) and the quantum barrier layers formed of AlInGaN with wider energy bands.

The electrons and holes injected respectively through the second semiconductor layer 160 and the first semiconductor layer 140 combine with each other in the active layer 150 to emit light. The emitted light exits through the second semiconductor layer 160.

N (N is a natural number) grooves 161 (take one groove 161 as an example in FIGS. 1-3) are formed on the surface of the second semiconductor layer 160 away from the active layer 150, and the depth of the grooves 161 is less than the thickness of the second semiconductor layer 160.

Specifically, the first electrode connecting part 121 and the second electrode connecting part 122 are located on both sides of a contact part 123 respectively. The flat parts 124 are located between the first electrode connecting part 121 and the contact part 123, and between the contact part 123 and the second electrode connecting part 122. If the number of contact parts 123 is two or more, the flat parts 124 are also located among the plurality of contact parts 123. The current diffusion layer 120 may be made of, for example, Indium Tin Oxides (ITO), or a combination layer of one or more metals such as aluminum, copper, gold, tungsten, or the like, or an alloy of various metals. Of course, the material of the current diffusion layer 120 is not limited herein, and it may be others.

The first electrode connecting part 121 is protruded from a side of the current diffusion layer 120 near the insulating base 110 toward a side away from the insulating base 110. The insulating layer 130 may be arranged between the first electrode connecting part 121 and sides of the first semiconductor layer 140, the active layer 150 and the second semiconductor layer 160. The first electrode connecting part 121 is connected to the first semiconductor layer 140 of a light-emitting structure layer 230 arranged on the flat part 124 through a flat part 124 adjacent thereto.

The second electrode connecting part 122 is protruded from a side of the current diffusion layer 120 near the insulating base 110 toward a side away from the insulating base 110. The insulating layer 130 may be arranged between the second electrode connecting part 122 and sides of the active layer 150, the first semiconductor layer 140 and a flat part 124 connected to the second electrode connecting part 122. A part of an end surface of the second electrode connecting part 122 away from the insulating base 110 is connected to the second semiconductor layer 160 of a light-emitting structure layer 230 adjacent thereto.

The contact part 123 is protruded from a side of the current diffusion layer 120 near the insulating base 110 to a side away from the insulating base 110. The insulating layer 130 may be arranged between the contact part 123 and sides of the active layer 150, the first semiconductor layer 140 and a flat part 124 located on one side of the contact part 123 (the side near the first electrode 170 in FIG. 2). The insulating layer 130 may also be arranged between the contact part 123 and sides of the second semiconductor layer 140, the active layer 150 located on the other side of the contact part 123 (the side near the second electrode 180 in FIG. 2).

An end surface of each of the contact parts 123 away from the insulating base 110 is connected to the second semiconductor layer 160 of a light-emitting structure layer 230 on a side of the contact part 123 near the first electrode connecting part 121, and connected to the first semiconductor layer 140 on the flat part 124 through a flat part 124 on a side of the contact part 123 near the second electrode connecting part 122.

In other words, the insulating layer 130 may be arranged between the first electrode connecting part 121 and sides of the second semiconductor layer 160, the active layer 150 and the first semiconductor layer 140. The insulating layer 130 may be arranged between the second electrode connecting part 122 and sides of the active layer 150, the first semiconductor layer 140 and the flat part 124 connected to the second electrode connecting part 122. The insulating layer 130 may also be arranged between the contact part 123 and sides of the active layer 150, the first semiconductor layer 140, and the flat part 124 located on one side of the contact part 123. It may be understood that sides of the first semiconductor layer 140, the active layer 150, the second semiconductor layer 160 and the flat parts 124 in the embodiments of the present invention refer to surfaces between a top surface (the surface away from the insulating base 110) and a bottom surface (the surface close to the insulating base 110) of the first semiconductor layer 140, the active layer 150, the second semiconductor layer 160 and the flat parts 124 respectively.

In this embodiment, the insulating layer 130 may be made of insulating materials such as silicon dioxide or silicon nitride. Of course, the material of the insulating layer 130 is not limited herein, and may be others.

In addition, a reflective metal layer 190 may be further formed between the first semiconductor layer 140 and the current diffusion layer 120. The reflective metal layer 190 may make a part of the light emitted from the active layer 150 be reflected and emit from the second semiconductor layer 160. In this embodiment, the material of the reflective metal layer 190 is not limited, and may be one of the metals which have a reflective effect on light, such as silver (Ag), aluminum (Al), nickel (Ni) or the like, or a metal alloy or a metal combination layer composed of various metals, or an alloy superlattice structure.

Furthermore, optionally, a conductive metal layer 200 may be formed between end surfaces of the contact parts 123 away from the insulating base 110 and the second semiconductor layer 160. The conductive metal layer 200 is located between corresponding contact parts 123 and the second semiconductor layer 160, which may increase the conductivity between the second semiconductor layer 160 and the current diffusion layer 120. Further, the conductive metal layer 200 may also be formed on an end surface of the second electrode connecting part 122 away from the insulating base 110.

Optionally, a surface of the second semiconductor layer 160 away from the insulating base 110 may be roughened or patterned. The surface of the second semiconductor layer 160 away from the first semiconductor layer 140 is roughened or has a pattern, which can further enhance the light extraction rate of the semiconductor light-emitting device 100.

FIG. 3 is a cross-sectional diagram illustrating a semiconductor light-emitting device shown in FIG. 2 after adding a passivation layer and electrodes. Please refer to FIG. 3, a passivation layer 210 may be formed on a surface of the second semiconductor layer 160 away from the first semiconductor layer 140, a bottom of the groove 161 and exposed parts of the current diffusion layer 120. The passivation layer 210 may prevent the oxidation of the second semiconductor layer 160 and the current diffusion layer 120. In this embodiment, the passivation layer 210 may be directly plated on the corresponding surface. The material of the passivation layer 210 is not limited herein, and may be silicon oxide, silicon nitride, or the like. Since the refractive index of the passivation layer 210 is between the second semiconductor layer 160 and air, the light extraction rate can also be improved.

Referring to FIG. 3, the first electrode 170 is formed on the first electrode connecting part 121, and the second electrode 180 is formed on the second electrode connecting part 122. Further, a first lead 171 may be soldered on the first electrode 170, and a second lead 181 may be soldered on the second electrode 180. Further, in a specific embodiment, a part of the second semiconductor layer 160 corresponding to the first electrode connecting part 121 may be etched away, and the first electrode 170 may be formed on the etched part. Further, in a specific embodiment, a part of the second semiconductor layer 160 corresponding to the second electrode connecting part 122 may be etched away, and the second electrode 180 may be formed on the etched part.

In a specific embodiment, the first electrode 170 may be electrically connected to the second electrode 180 through the first electrode connecting part 121, the flat part 124 near the first electrode connecting part 121, the first semiconductor layer 140, the active layer 150 and the second semiconductor layer 160 of the light-emitting structure layer 230 near the first electrode connecting part 121, the contact part 123, the flat part 124 near the second electrode connecting part 122, the first semiconductor layer 140, the active layer 150 and the second semiconductor layer 160 of the light-emitting structure layer 230 near the second electrode connecting part 122, and the second electrode connecting part 122 in sequence.

In this embodiment, the first electrode 170 and the second electrode 180 are located on the same side of the active layer 150, so as to avoid the problem that the packaging process of the traditional vertical electrode with the different-side structure introduces a large front-end voltage.

Figure 4:
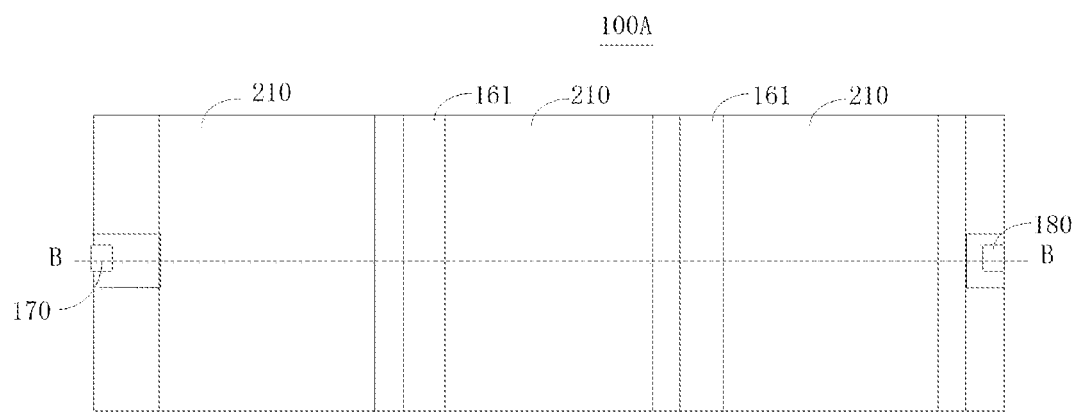
FIG. 4 is a top view illustrating a semiconductor light-emitting device in one specific embodiment according to a preferred embodiment of the present invention.
Figure 5:
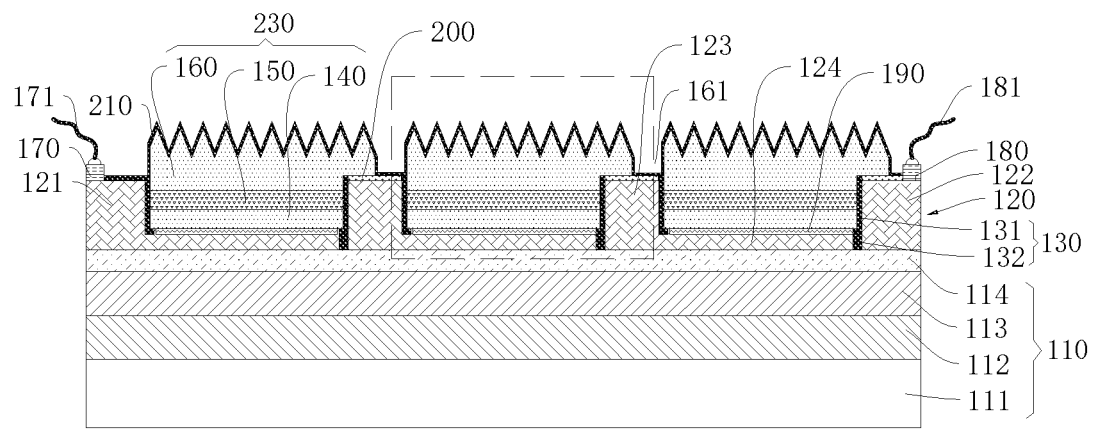
FIG. 5 is a cross-sectional diagram along line B-B in FIG. 4.

It can be understood that the number N of grooves 161 and contact parts 123 is not limited in the embodiments of the present invention, and may be set according to the actual requirements. For example, as shown in FIGS. 4-5, FIG. 4 is a top view illustrating a semiconductor light-emitting device in one specific embodiment according to a preferred embodiment of the present invention, and FIG. 5 is a cross-sectional diagram along line B-B in FIG. 4. In this specific embodiment, the number of the grooves 161 may be two, correspondingly, the number of the contact parts 123 is also two. The two grooves 161 and the two contact parts 123 divide the first semiconductor layer 140, the active layer 150 and the second semiconductor layer 160 into three light-emitting structure layers 230. The part enclosed by the dotted lines in FIG. 5 represents one light-emitting structure layer 230.

Figure 6:
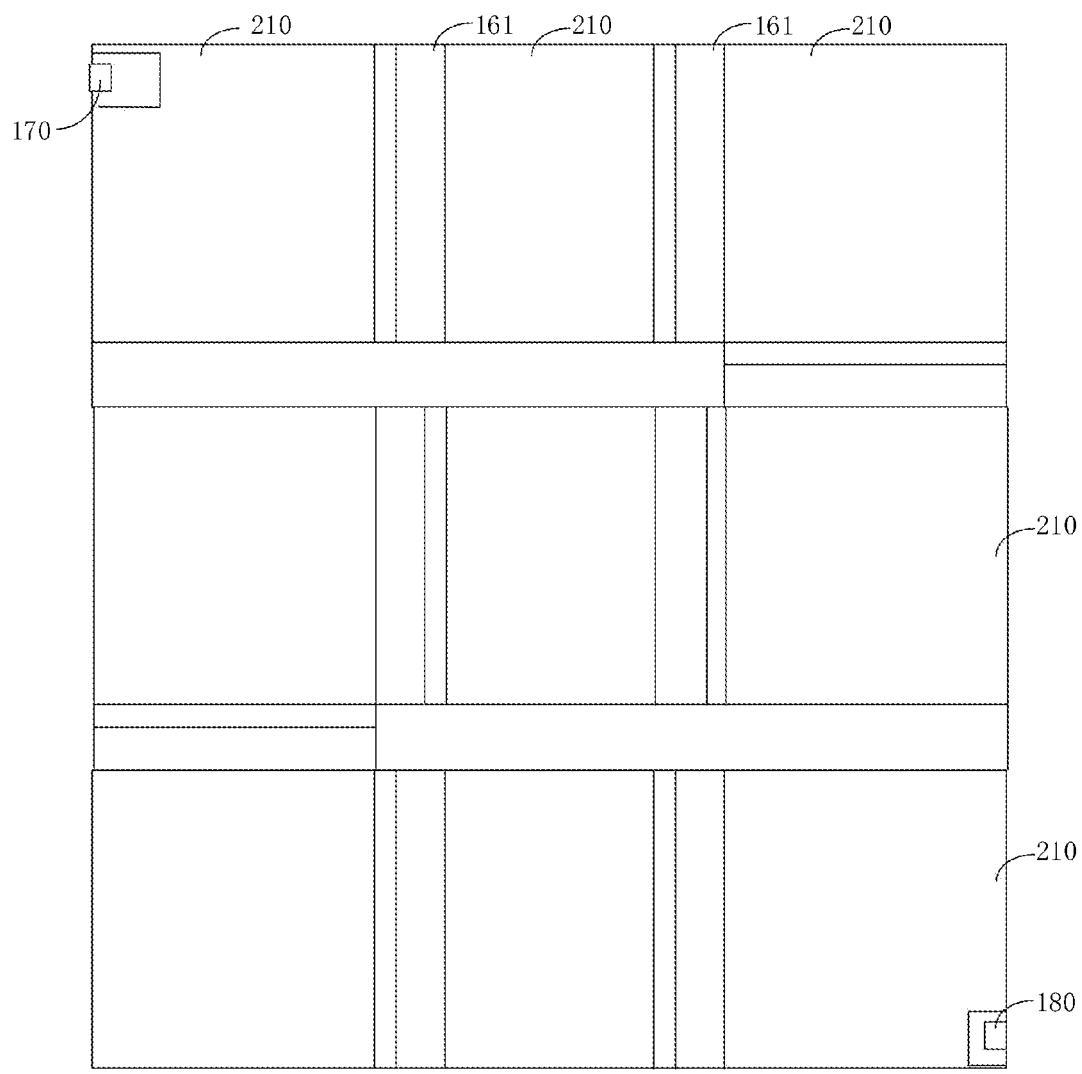
FIG. 6 is a top view illustrating a semiconductor light-emitting device in another specific embodiment according to a preferred embodiment of the present invention.

Understandably, the numbers of the grooves 161 and the contact parts 123 may be more, and the arrangement mode of the grooves 161 and the contact parts 123 may be not limited to a linear type. For example, in FIG. 6, the number of the grooves 161 and the contact parts 123 is 8, and the grooves 161 and the contact parts 123 are arranged in a serpentine shape. That is, the number and design of the light-emitting structure layers 230 are flexible, and the number of rows and columns of the light-emitting structure layers 230 may be not limited herein.

Figure 7:
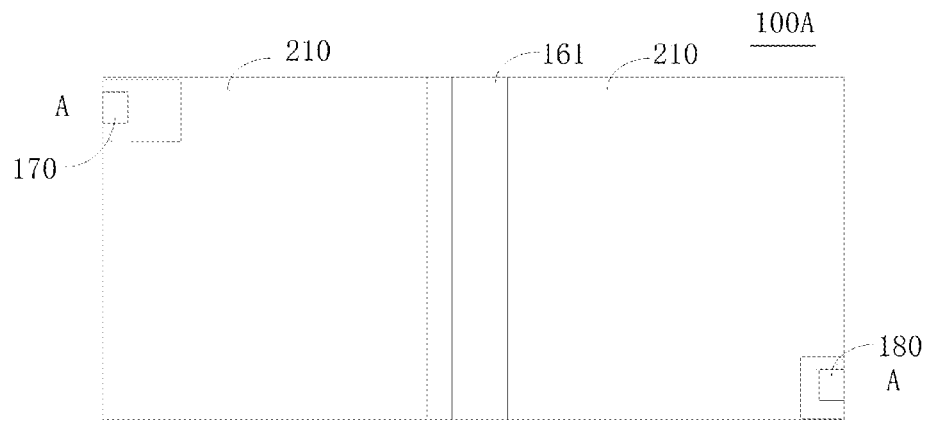
FIG. 7 is a top view illustrating a semiconductor light-emitting device in still another specific embodiment according to a preferred embodiment of the present invention.

Understandably, the positions of the first electrode 170 and the second electrode 180 may also be flexibly arranged. For example, the first electrode 170 and the second electrode 180 may be symmetrically arranged on two sides of the groove 161 as shown in FIG. 1, and located at the centers of the two sides respectively, or may be diagonally arranged on the two sides of the groove 161 as shown in FIG. 7.

Figure 8:
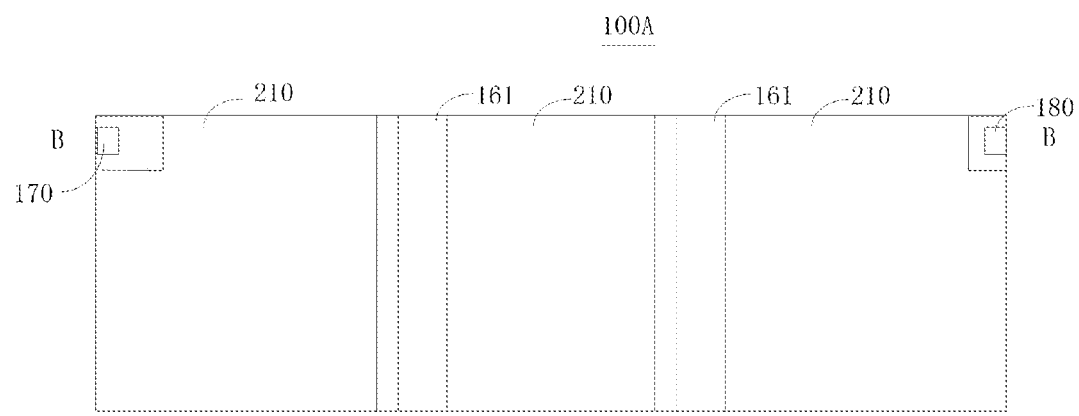
FIG. 8 is a top view illustrating a semiconductor light-emitting device in still another specific embodiment according to a preferred embodiment of the present invention.

Understandably, in a structure with three or more light-emitting structure layers 230, the positions of the first electrode 170 and the second electrode 180 may also be flexibly arranged. For example, as shown in FIG. 4, the first electrode 170 and the second electrode 180 may be symmetrically arranged on two sides of two grooves 161, and located at the centers of the two sides respectively, or diagonally, and may also be arranged at two top corners on a side perpendicular to the grooves 161 as shown in FIG. 8.

Figure 9:
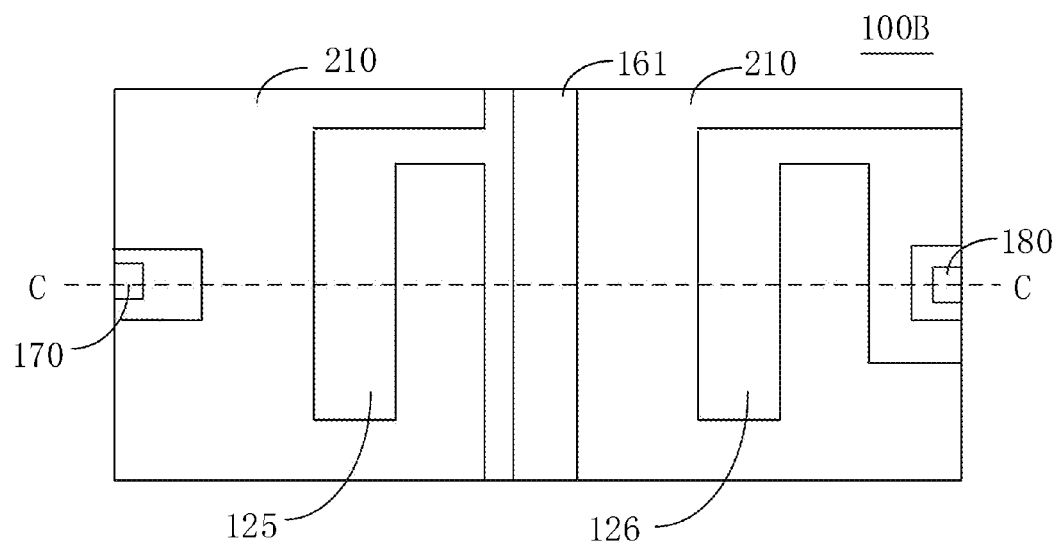
FIG. 9 is a top view illustrating a semiconductor light-emitting device according to another preferred embodiment of the present invention.
Figure 10:
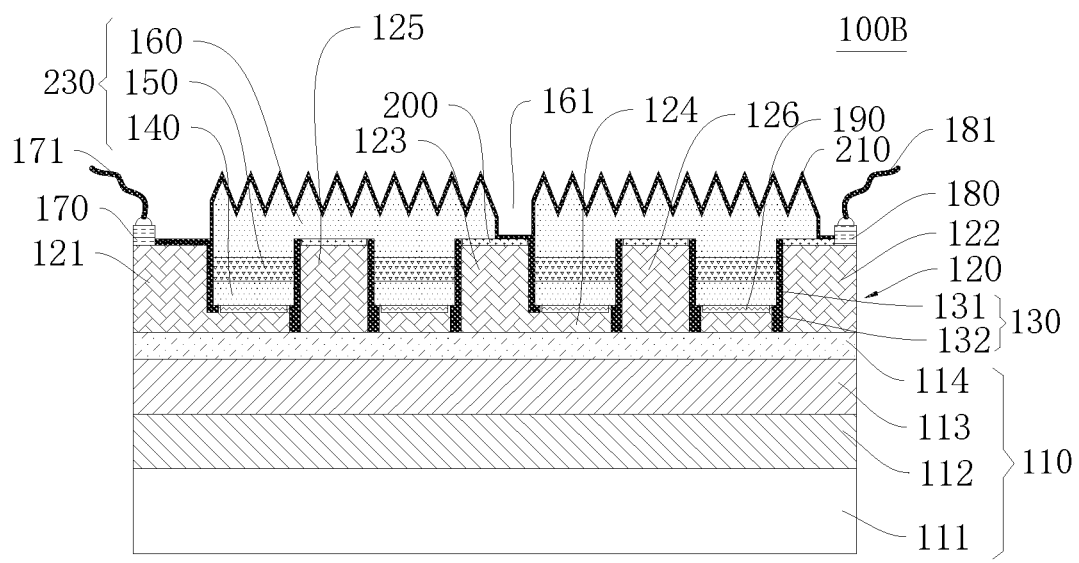
FIG. 10 is a cross-sectional diagram along line C-C in FIG. 9.

FIG. 9 is a top view illustrating a semiconductor light-emitting device according to another preferred embodiment of the present invention, and FIG. 10 is a cross-sectional diagram along line C-C in FIG. 9. Referring to FIGS. 9-10, understandably, in other embodiments of the present invention, the current diffusion layer 120 of a semiconductor light-emitting device 100B may also include one or more first tunnel electrodes 125 electrically connected to the contact part 123, and one or more second tunnel electrodes 126 electrically connected to the second electrode 180. The first tunnel electrodes 125 are arranged between the first electrode connecting part 121 and the contact part 123, and the second tunnel electrodes 126 are arranged between the second electrode connecting part 122 and the contact part 123, which can help to spread current. The first tunnel electrodes 125 and the second tunnel electrodes 126 may be finger-shaped electrodes, or electrodes in other shapes. The design of the first tunnel electrodes 125 and the second tunnel electrodes 126 is flexible, and the number of them is not limited. For example, the number of the first tunnel electrodes 125 and the second tunnel electrodes 126 may be one or more.

Taking FIGS. 9-10 as an example, the first tunnel electrode 125 may be arranged between the first electrode connecting part 121 and the contact part 123. The first tunnel electrode 125 is protruded from a side of the current diffusion layer 120 near the insulating base 110 toward a side of the current diffusion layer 120 away from the insulating base 110, but does not pass through the second semiconductor layer 160. The insulating layer 130 is also disposed on both sides of the first tunnel electrode 125, and the first tunnel electrode 125 is electrically connected to the contact part 123. An end surface of the first tunnel electrode 125 near the insulating base 110 is connected to the insulating base 110, and an end surface of the first tunnel electrode 125 away from the insulating base 110 is electrically connected to the second semiconductor layer 160 of the corresponding light-emitting structure layer 230.

The second tunnel electrodes 126 may be arranged between the second electrode connecting part 122 and the contact part 123. The second tunnel electrode 126 is protruded from a side of the current diffusion layer 120 near the insulating base 110 toward the a side of the current diffusion layer 120 away from the insulating base 110, but does not pass through the second semiconductor layer 160. The insulating layer 130 is also disposed on both sides of the second tunnel electrode 126, and the second tunnel electrode 126 is electrically connected to the second electrode 180. An end surface of the second tunnel electrode 126 near the insulating base 110 is connected to the insulating base 110, and an end surface of the second tunnel electrode 126 away from the insulating base 110 is electrically connected to the second semiconductor layer 160 of the corresponding light-emitting structure layer 230.

Figure 11:
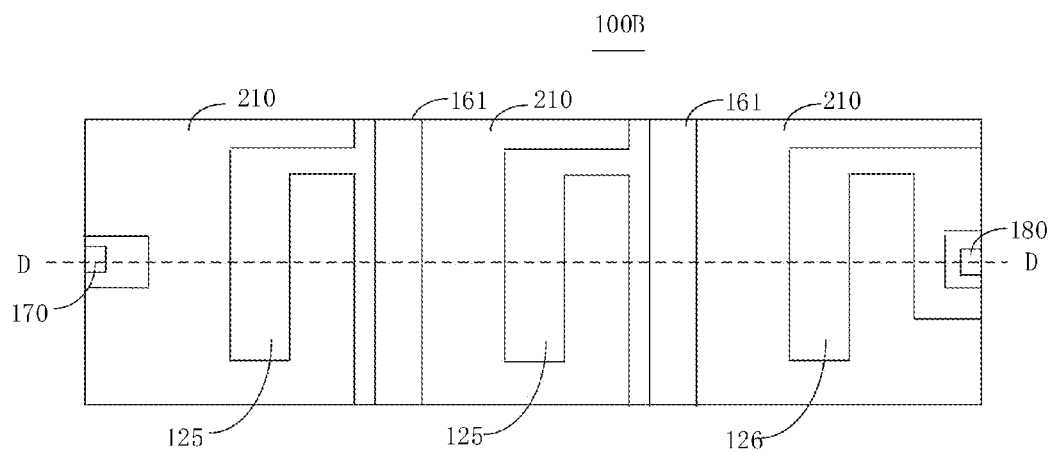
FIG. 11 is a top view illustrating a semiconductor light-emitting device in one specific embodiment according to another preferred embodiment of the present invention.
Figure 12:
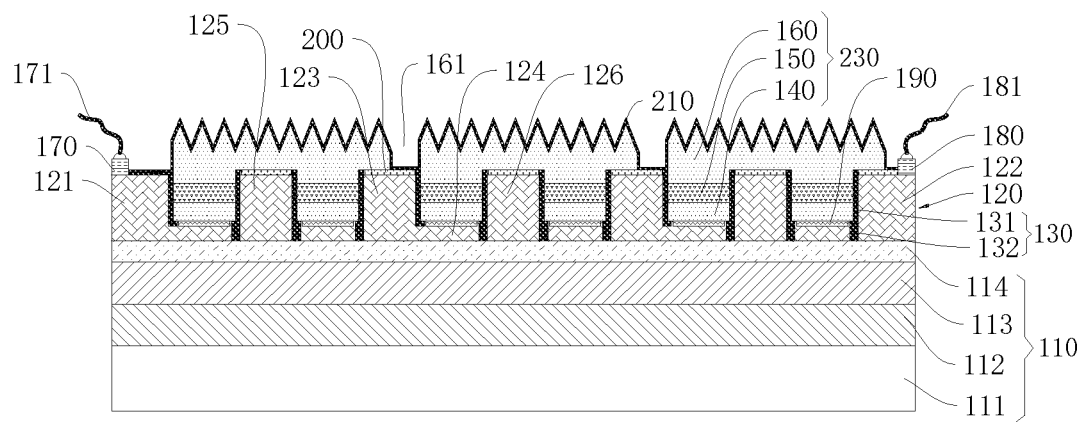
FIG. 12 is a cross-sectional diagram along line D-D in FIG. 11.

Understandably, in the embodiment shown in FIGS. 4-5, each light-emitting structure layer 230 may also be equipped with one or more tunnel electrodes. As shown in FIGS. 11-12, FIG. 11 is a top view illustrating a semiconductor light-emitting device in one specific embodiment according to another preferred embodiment of the present invention, and FIG. 12 is a cross-sectional diagram along line D-D in FIG. 11. The specific number and arrangement of the tunnel electrodes are not limited. Using the tunnel electrodes can help to spread the current. When the size of the semiconductor light-emitting element increases, the diffusion effect of the tunnel electrodes is better.

Understandably, FIGS. 9-10 are merely one embodiment of the first tunnel electrode 125 and the second tunnel electrode 126. In other embodiments, the fingers of the first tunnel electrode 125 and the second tunnel electrode 126 may also be multiple, can be parallel to or perpendicular to the groove 161, for example, as shown in FIGS. 13-14.

Figure 13:
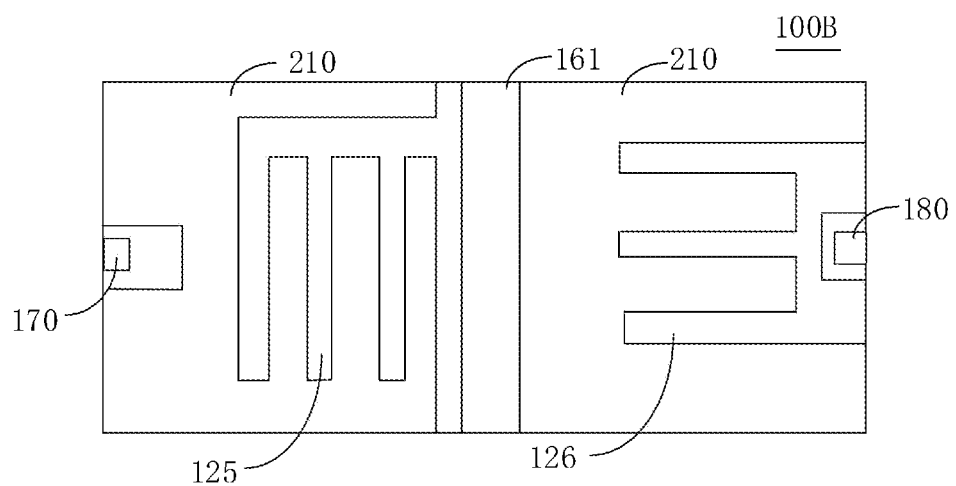
FIG. 13 is a top view illustrating a semiconductor light-emitting device in another specific embodiment according to another preferred embodiment of the present invention.
Figure 14:
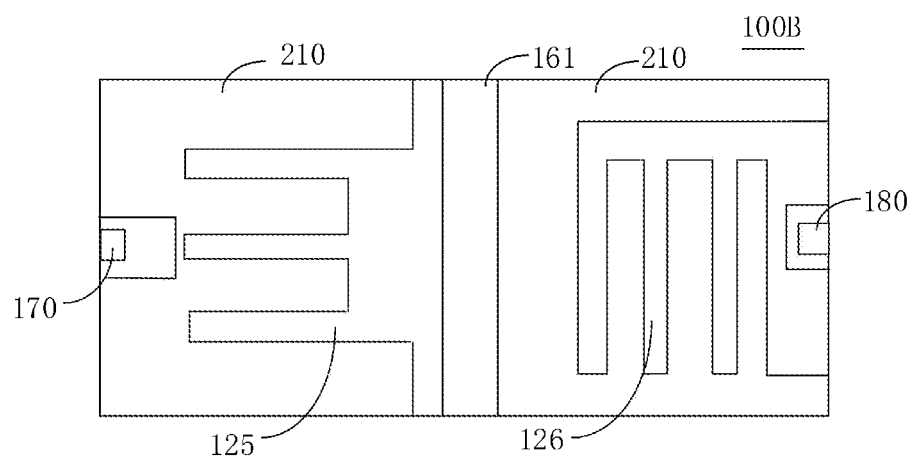
FIG. 14 is a top view illustrating a semiconductor light-emitting device in still another specific embodiment according to another preferred embodiment of the present invention.
Figure 15:
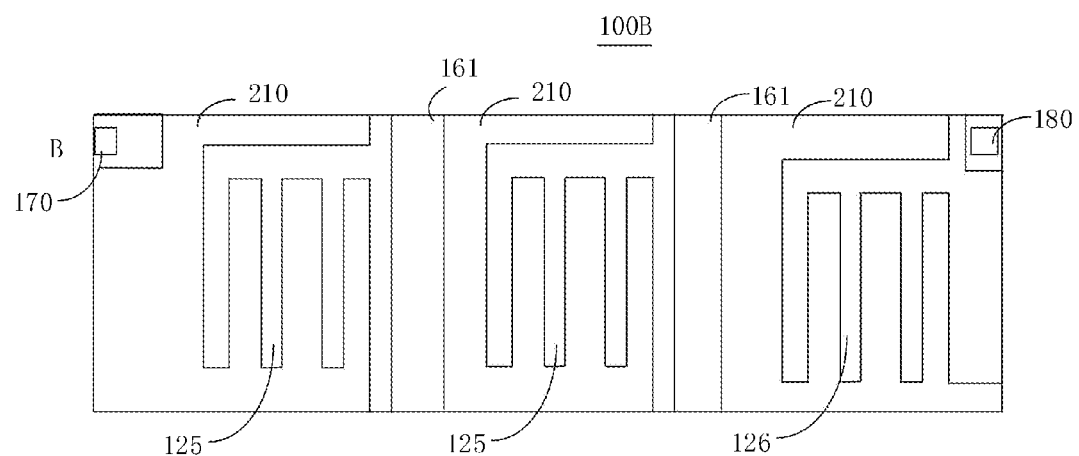
FIG. 15 is a top view illustrating a semiconductor light-emitting device in still another specific embodiment according to another preferred embodiment of the present invention.
Figure 16:
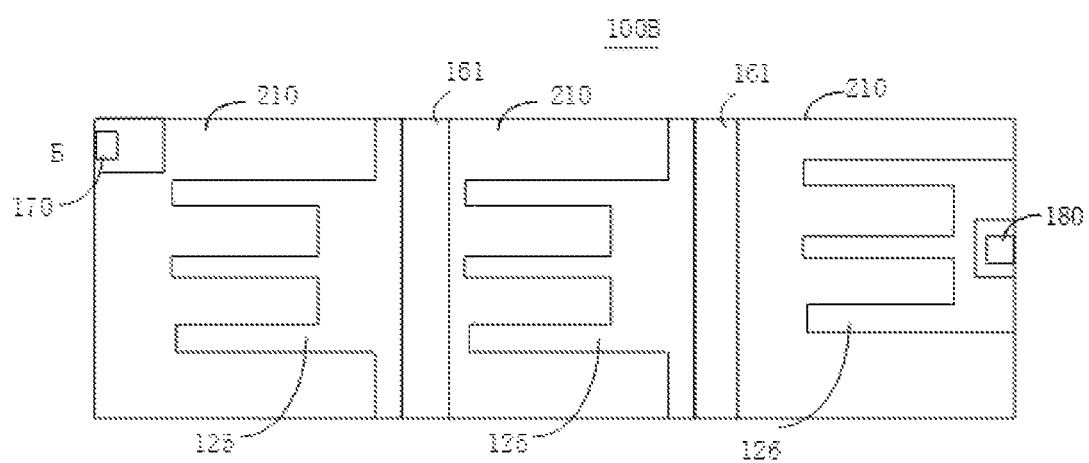
FIG. 16 is a top view illustrating a semiconductor light-emitting device in still another specific embodiment according to another preferred embodiment of the present invention.

Similarly, FIGS. 13-14 are merely one embodiment of the first tunnel electrode 125 and the second tunnel electrode 126. In other embodiments, the fingers of the first tunnel electrode 125 and the second tunnel electrode 126 may also be multiple, can be parallel to or perpendicular to the groove 161. At the same time, the first electrode 170 and the second electrode 180 may also be arranged at different positions, for example, as shown in FIGS. 15-16.

Figure 17:
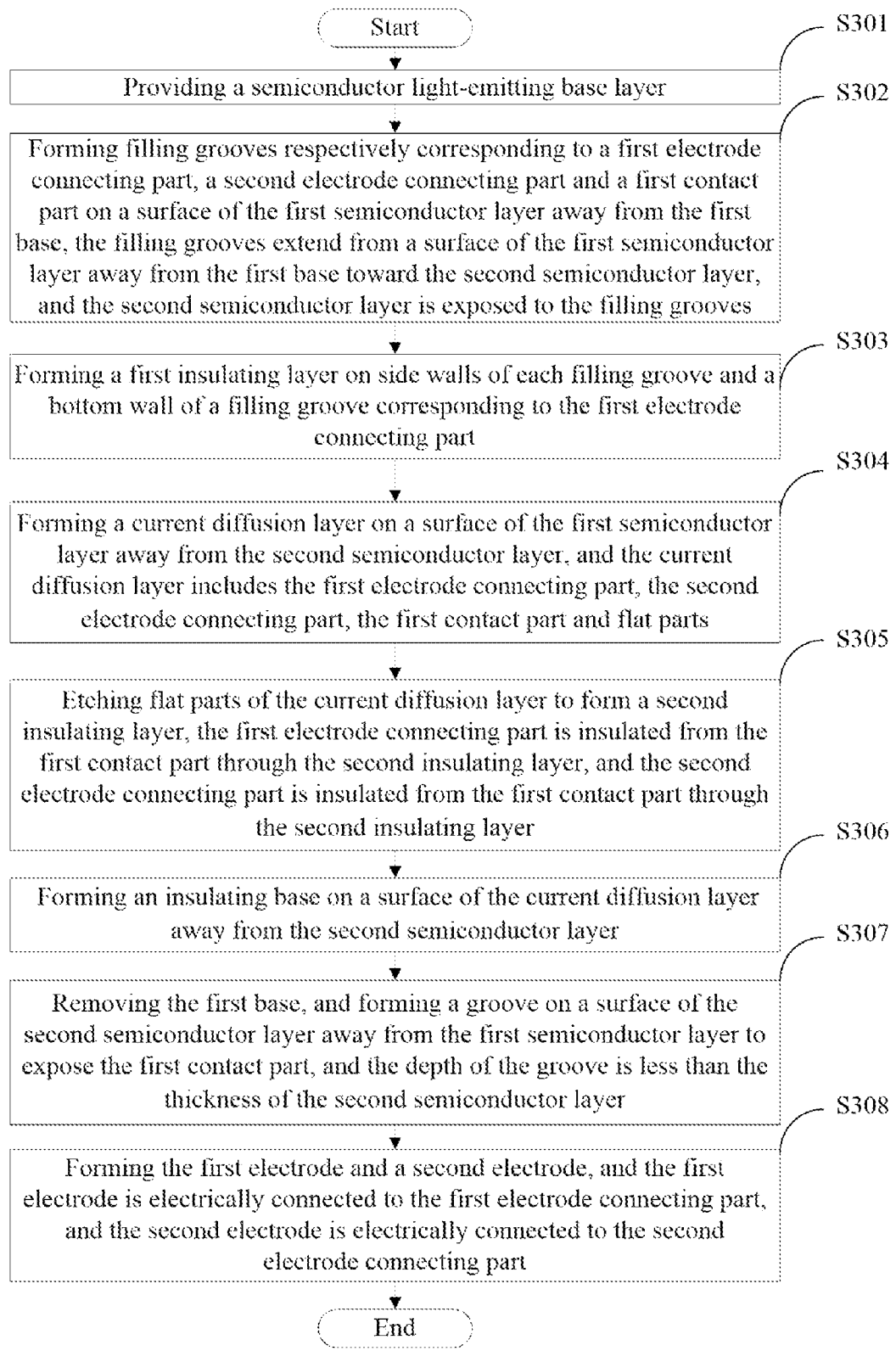
FIG. 17 is a process flowchart illustrating a manufacturing method for a semiconductor light-emitting device according to a preferred embodiment of the present invention.

FIG. 17 is a process flowchart illustrating a manufacturing method for a semiconductor light-emitting device according to a preferred embodiment of the present invention. The process flowchart will be described in detail below conjunction with FIGS. 18-36. It should be explained that the method described in the embodiments of the present invention is not limited by FIG. 17 and the specific order described below. It may be understood that, the order of some steps in the method described in other embodiments of the present invention may be exchanged according to actual requirements, or some of the steps may also be omitted or deleted.

S301: providing a semiconductor light-emitting base layer 220.

Figure 18:
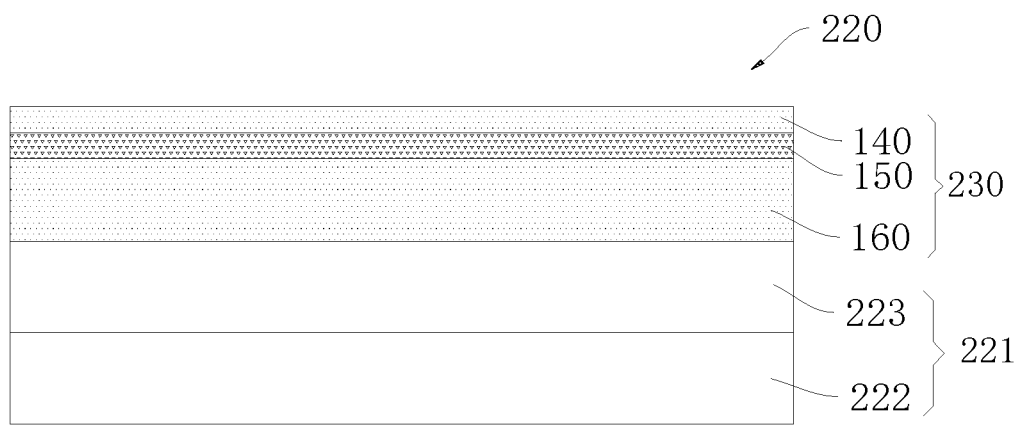
FIGS. 18-36 are schematic diagrams illustrating each component of a semiconductor light-emitting device in each step of a manufacturing method for the semiconductor light-emitting device according to a preferred embodiment of the present invention.

Referring to FIG. 18, the semiconductor light-emitting base layer 220 includes a first base 221, and a second semiconductor layer 160, an active layer 150 and a first semiconductor layer 140 which are sequentially formed on the first base 221.

The second semiconductor layer 160, the active layer 150 and the first semiconductor layer 140 may be sequentially grown on a surface of the first base 221. Preferably, the first base 221 may include a second substrate 222 and a buffer layer 223 grown on the second substrate 222, and the second semiconductor layer 160, the active layer 150 and the first semiconductor layer 140 may be grown on the buffer layer 223.

S302: forming filling grooves 141 respectively corresponding to a first electrode connecting part 121, a second electrode connecting part 122 and a contact part 123 in FIG. 2 on a surface of the first semiconductor layer 140 away from the first base 221. The filling grooves 141 extend from a surface of the first semiconductor layer 140 away from the first base 221 toward the second semiconductor layer 160, and the second semiconductor layer 160 is exposed to the filling grooves 141.

Figure 19:
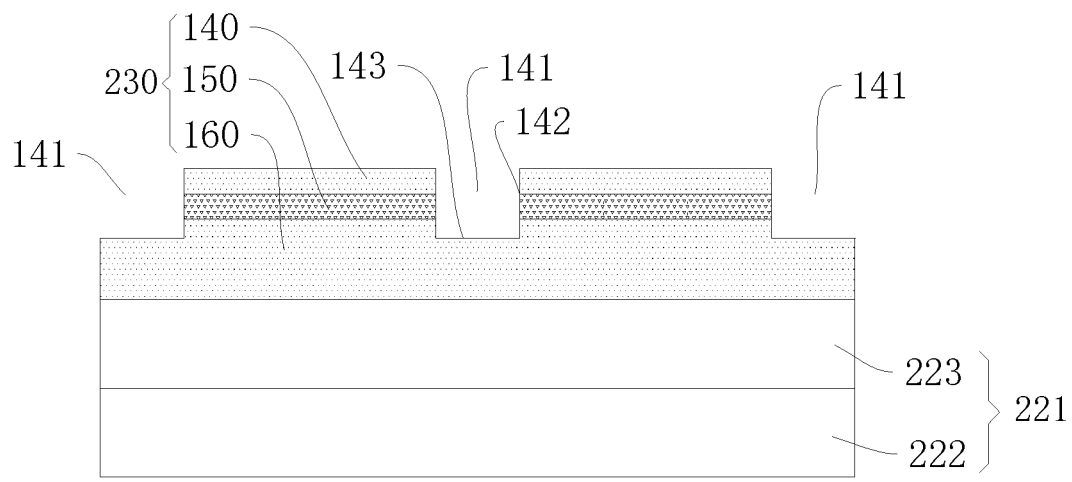

Specifically, referring to FIG. 19, in this step, three filling grooves 141 are etched at intervals on the surface of the first semiconductor layer 140 away from the first base 221, and the three filling grooves 141 are respectively corresponding to the first electrode connecting part 121, the second electrode connecting part 122 and the contact part 123 in the semiconductor light-emitting device shown in FIG. 2. After etching, the second semiconductor layer 160 is exposed at the filling grooves 141. The etching depth in the second semiconductor layer 160 is less than the thickness of the second semiconductor layer 160.

S303: forming a first insulating layer 131 on side walls 142 of each filling groove 141 and a bottom wall 143 of a filling groove 141 corresponding to the first electrode connecting part 121.

Figure 20:
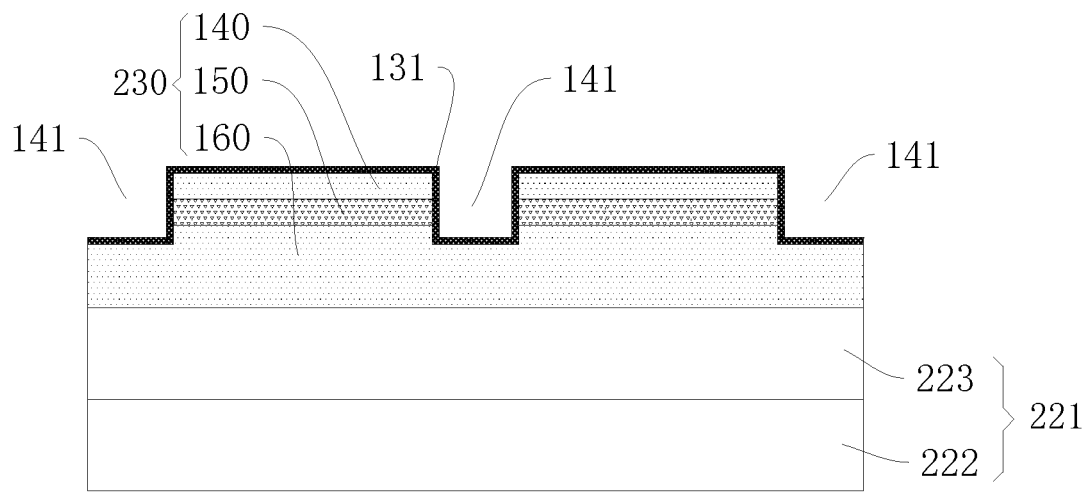

Specifically, referring to FIG. 20, the first insulating layer 131 may be formed on the surface of the first semiconductor layer 140 away from the first base 221, the side walls 142 and the bottom wall 143 of each filling groove 141 by chemical vapor deposition (CVD) or other methods. The first insulating layer 131 may be made of an insulating material such as silicon dioxide or silicon nitride. Of course, the material of the first insulating layer 131 is not limited herein, and may be others.

Figure 21:
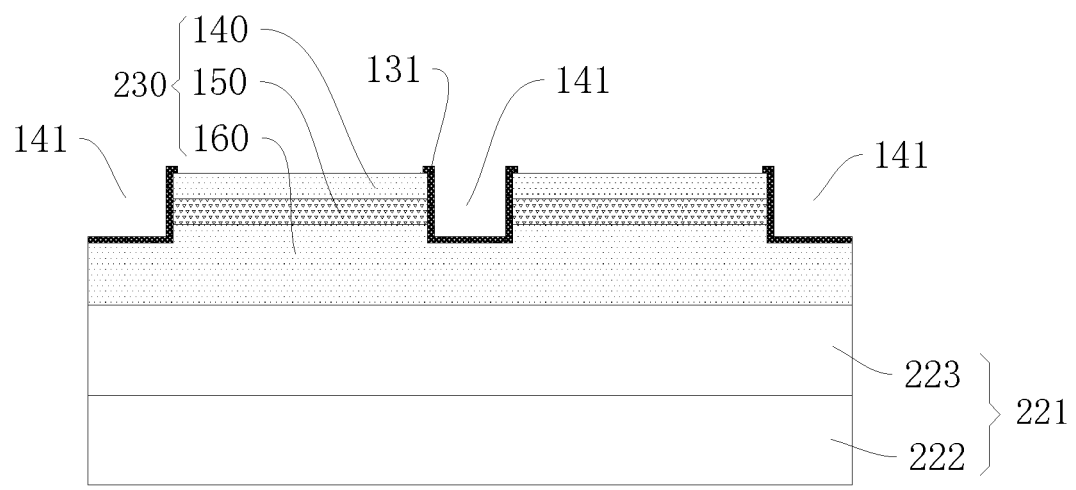

Further, referring to FIG. 21, the surface of the first semiconductor layer 140 away from the first base 221 may be exposed by the first insulating layer 131 through the methods such as photolithography, deposition, etching and so on.

Figure 22:
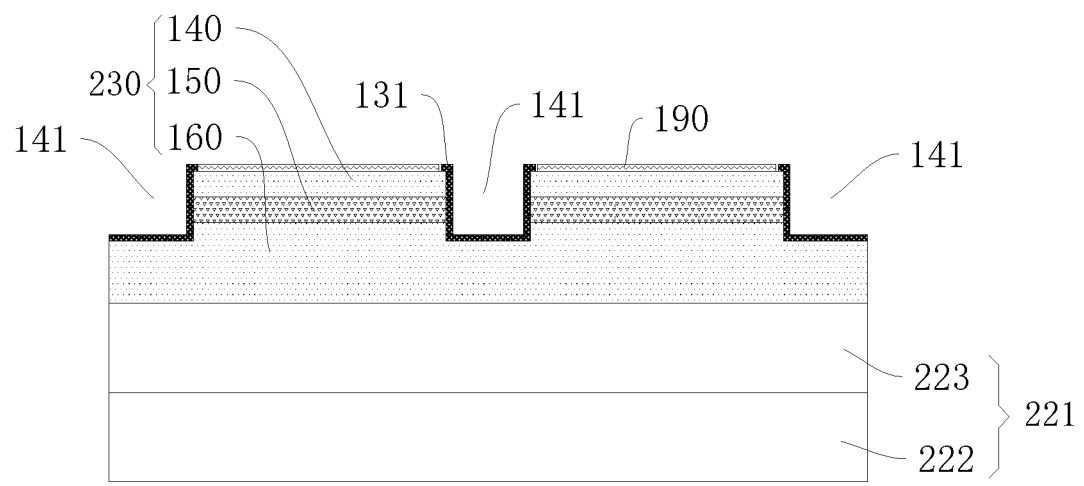

Further, referring to FIG. 22, a reflective metal layer 190 may be formed on parts of the first semiconductor layer 140 exposed by the first insulating layer 131. The reflective metal layer 190 may make a part of the light emitted from the active layer 150 be reflected and emit from the second semiconductor layer 160. In this embodiment, the material of the reflective metal layer 190 is not limited, and may be one of the metals which have a reflective effect on light, such as silver (Ag), aluminum (Al), nickel (Ni) or the like, or a metal alloy or metal combination layer composed of various metals, or an alloy superlattice structure.

Figure 23:
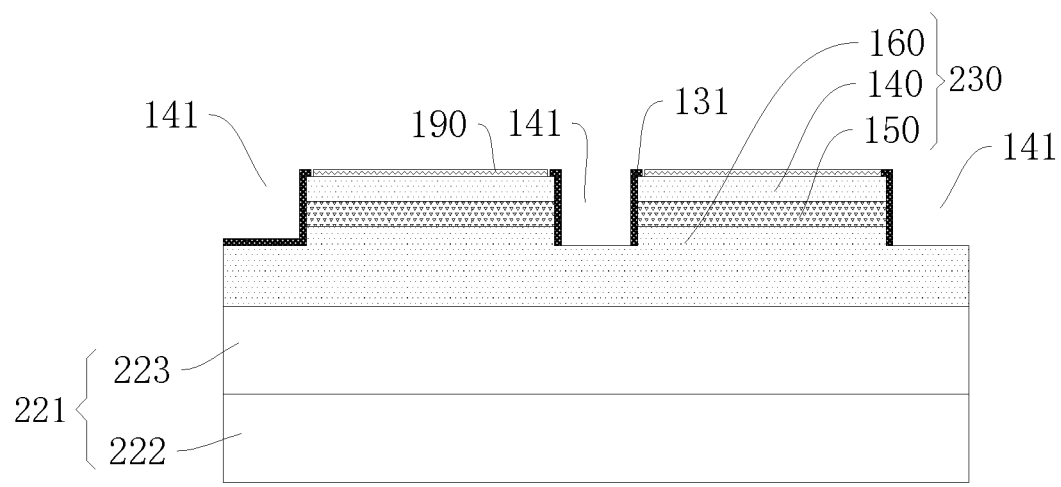

Further, referring to FIG. 23, etching the first insulating layer 131 on bottom walls 143 of the filling grooves 141 except the bottom wall 143 of the filling groove 141 corresponding to the first electrode connecting part 121, and retaining the first insulating layer 131 on the bottom wall 143 of the filling groove 141 corresponding to the first electrode connecting part 121, so as to prepare for the subsequent preparation of the first electrode 170.

Figure 24:
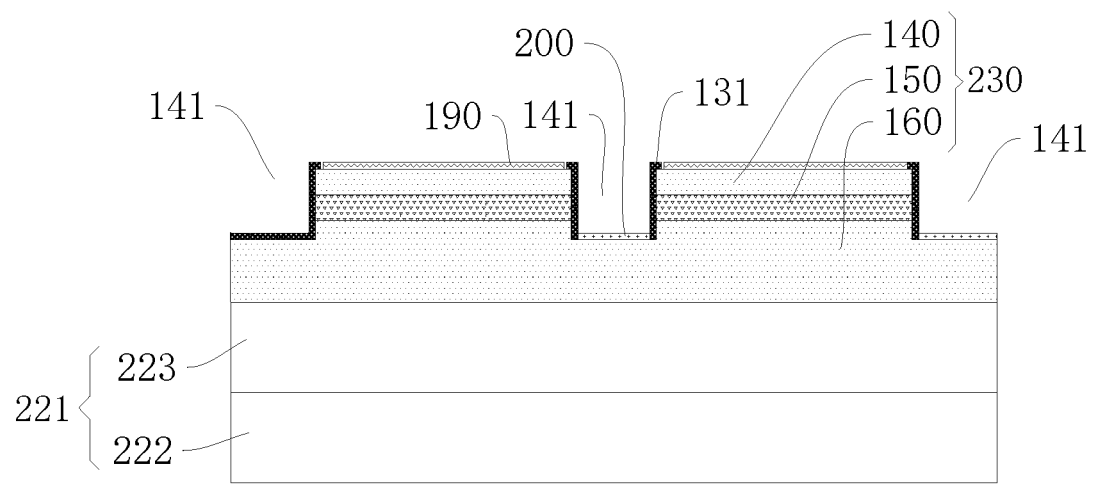

Optionally, referring to FIG. 24, a conductive metal layer 200 may also be formed on parts where the first insulating layer 131 is etched away to increase conductivity.

S304: forming a current diffusion layer 120 on a surface of the first semiconductor layer 140 away from the second semiconductor layer 160, and the current diffusion layer 120 includes the first electrode connecting part 121, the second electrode connecting part 122, the contact part 123 and flat parts 124.

Figure 25:
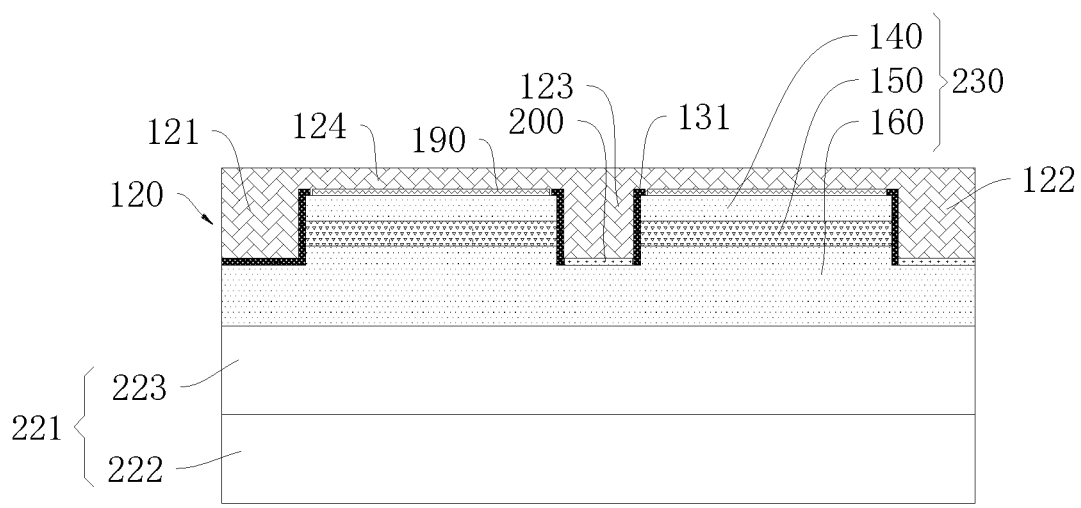

Referring to FIG. 25, in this step, the current diffusion layer 120 is plated on the surface of the first semiconductor layer 140 away from the second semiconductor layer 160. The first electrode connecting part 121 is formed by the part of the current diffusion layer 120 filled in the filling groove 141 corresponding to the first electrode connecting part 121, the second electrode connecting part 122 is formed by the part of the current diffusion layer 120 filled in the filling groove 141 corresponding to the second electrode connecting part 122, and the contact part 123 is formed by the part of the current diffusion layer 120 filled in the filling groove 141 corresponding to the contact part 123. The connection part between the first electrode connecting part 121 and the contact part 123, and the connection part between the contact part 123 and the second electrode connecting part 122 are the flat parts 124. The maximum thickness of the current diffusion layer 120 is larger than the distance between the reflective metal layer 190 and the bottom walls of the filling grooves 141, therefore, the surface of the current diffusion layer 120 away from the second semiconductor layer 160 is a flat surface.

S305: etching flat parts 124 of the current diffusion layer 120 to form a second insulating layer 132. The second insulating layer 132 is formed between a flat part 124 connected to the first electrode connecting part 121 and the contact part 123, and between a flat part 124 connected to the contact part 123 and the second electrode connecting part 122.

Figure 26:
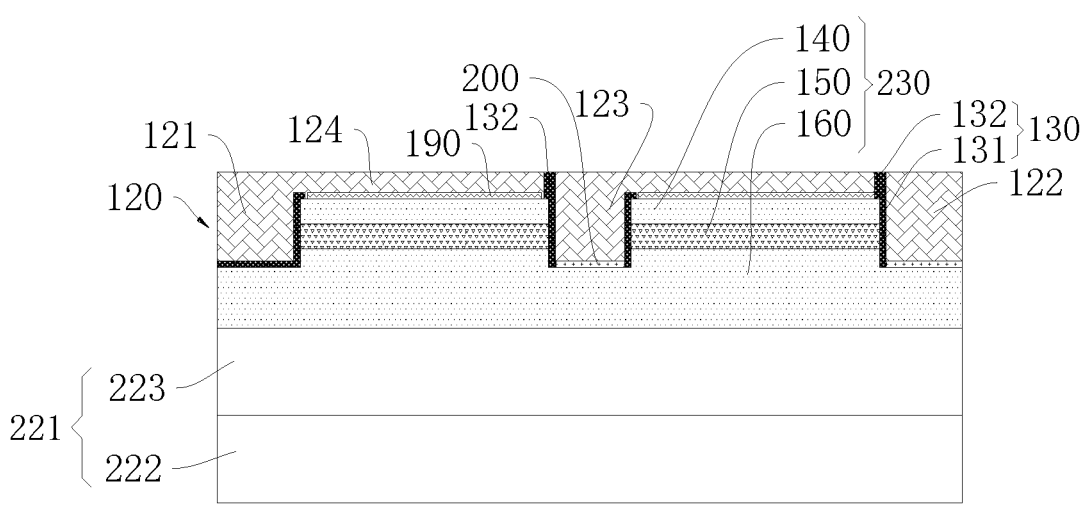

Referring to FIG. 26, in this step, the flat parts 124 of the current diffusion layer 120 may be selectively etched to form a pattern, and then the second insulating layer 132 is plated on the etched pattern. The second insulating layer 132 acts as a resistance break, and may break electrical connection at the locations where no electrical connectivity is required.

S306: forming an insulating base 110 on a surface of the current diffusion layer 120 away from the second semiconductor layer 160.

Figure 27:
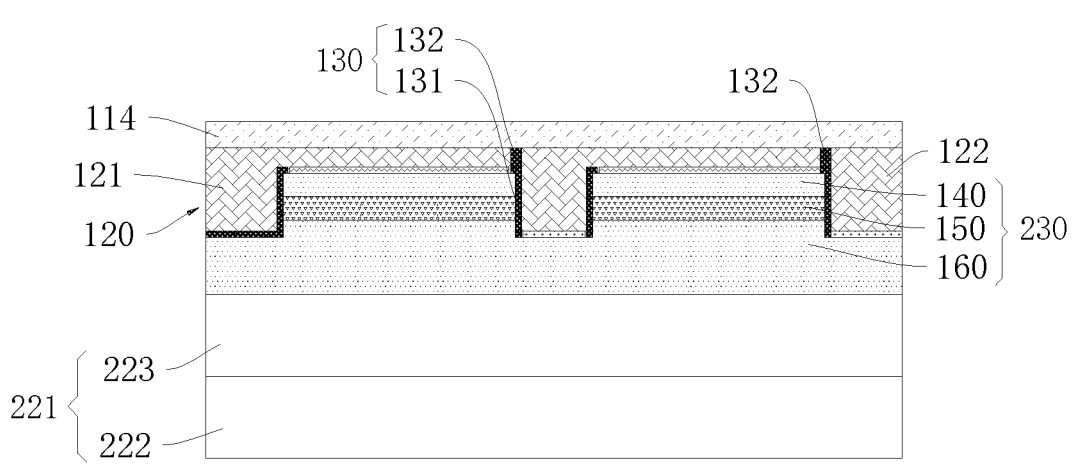
Figure 28:
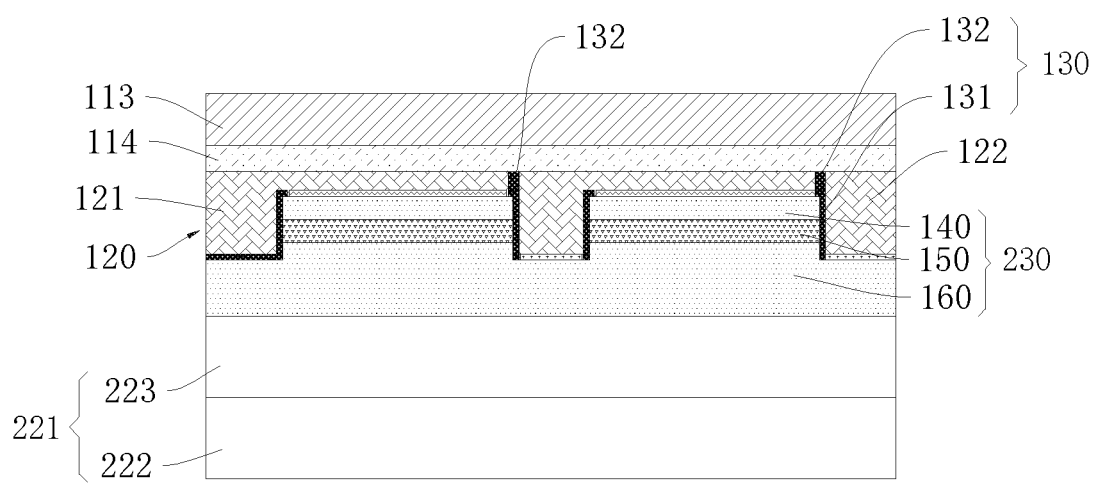

In a specific embodiment, referring to FIG. 27, an insulating base layer 114 may be formed on the surface of the current diffusion layer 120 away from the second semiconductor layer 160, and then a second bonding metal layer 113 may be plated on the insulating base layer 114, as shown in FIG. 28.

Figure 29:
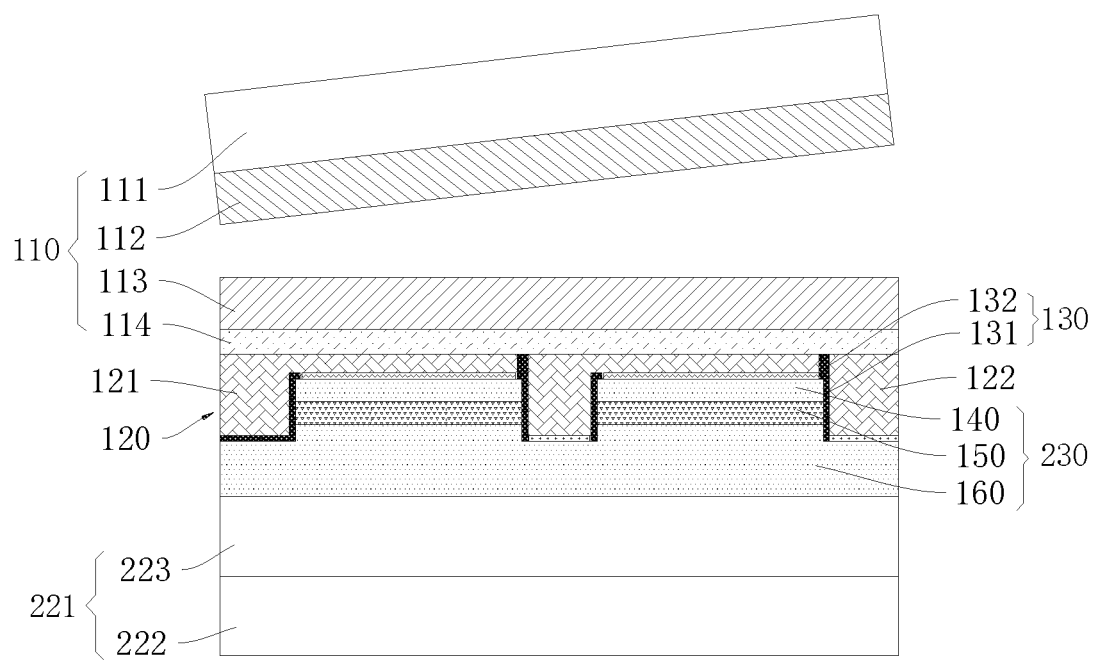
Figure 30:
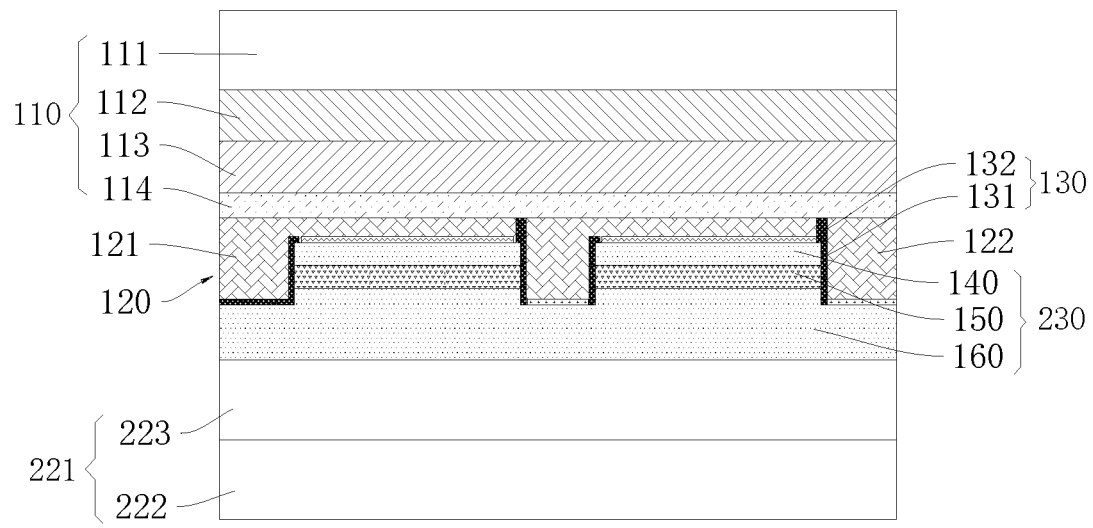

As shown in FIG. 29, preparing a first substrate 111 plated with a first bonding metal layer 112, and then bonding the first bonding metal layer 112 to the second bonding metal layer 113, as shown in FIG. 30.

S307: removing the first base 221, and forming a groove 161 on a surface of the second semiconductor layer 160 away from the first semiconductor layer 140 to expose the contact part 123. The depth of the groove 161 is less than the thickness of the second semiconductor layer 160.

Figure 31:
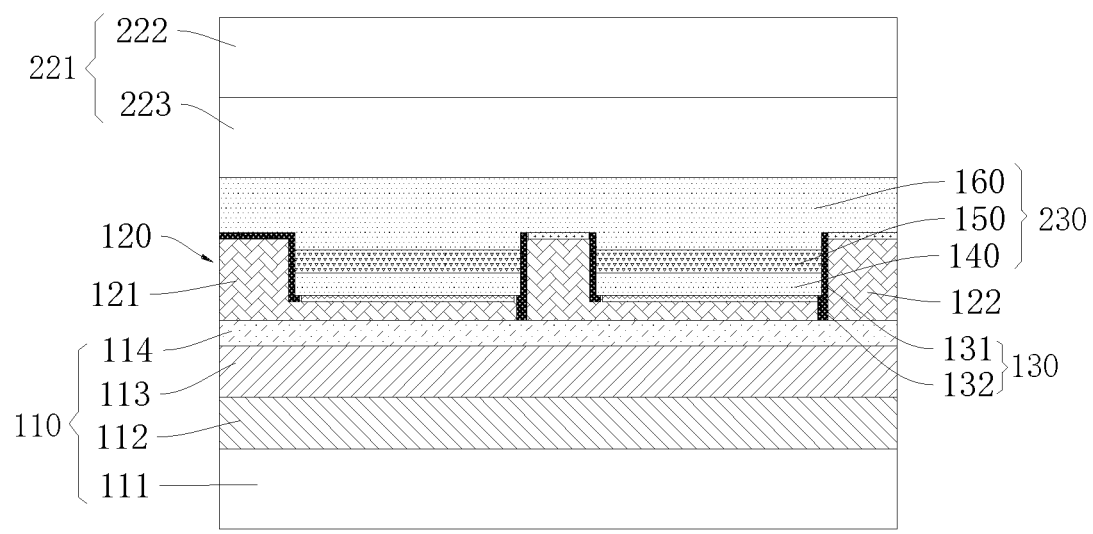
Figure 32:
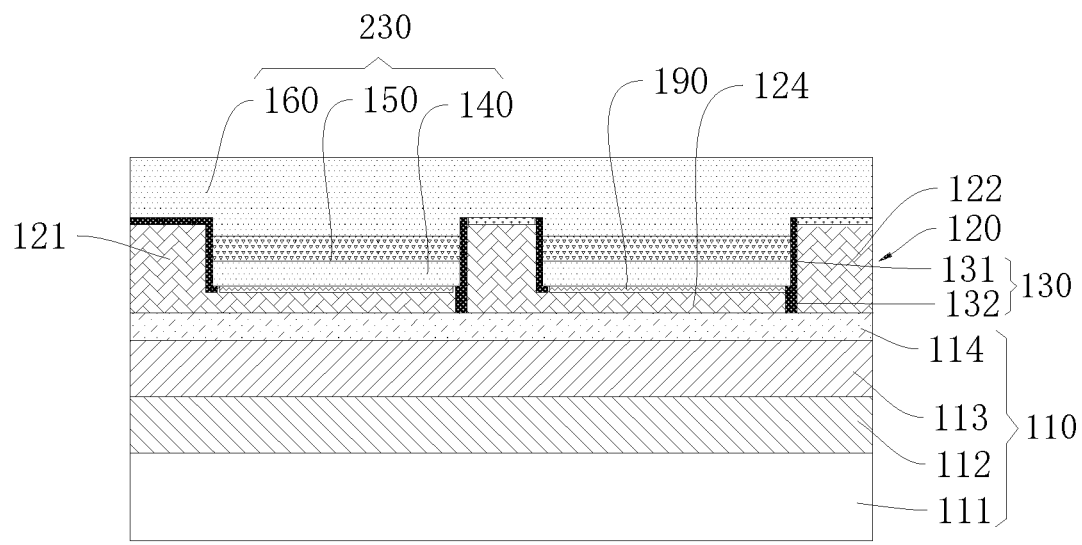
Figure 33:
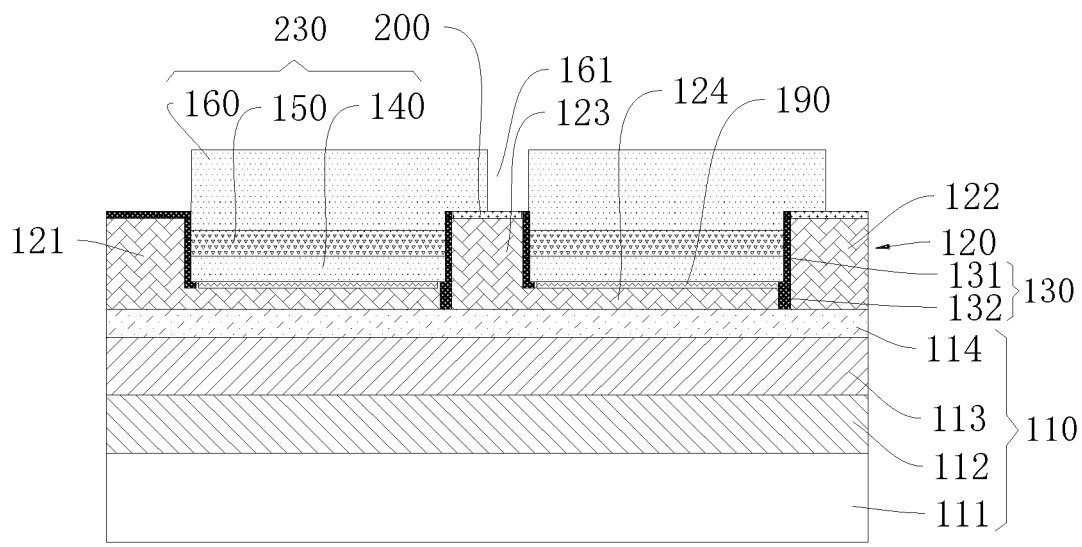

Referring to FIG. 31, FIG. 31 is a schematic diagram illustrating an overturned overall structure after bonding. Next, as shown in FIG. 32, removing the first base 221. Referring to FIG. 33, forming the groove 161 on the surface of the second semiconductor layer 160 away from the first semiconductor layer 140 to expose the contact part 123. Preferably, the part of the second semiconductor layer 160 corresponding to the first electrode connecting part 121 may be etched away to expose the first electrode connecting part 121, and the part of the second semiconductor layer 160 corresponding to the second electrode connecting part 122 is etched away to expose the second electrode connecting part 122. Specifically, the first insulating layer 131 on the first electrode connecting part 121 and the conductive metal layer 200 on the second electrode connecting part 122 are exposed.

S308: forming the first electrode 170 and a second electrode 180, and the first electrode 170 is electrically connected to the first electrode connecting part 121, and the second electrode 180 is electrically connected to the second electrode connecting part 122.

Figure 34:
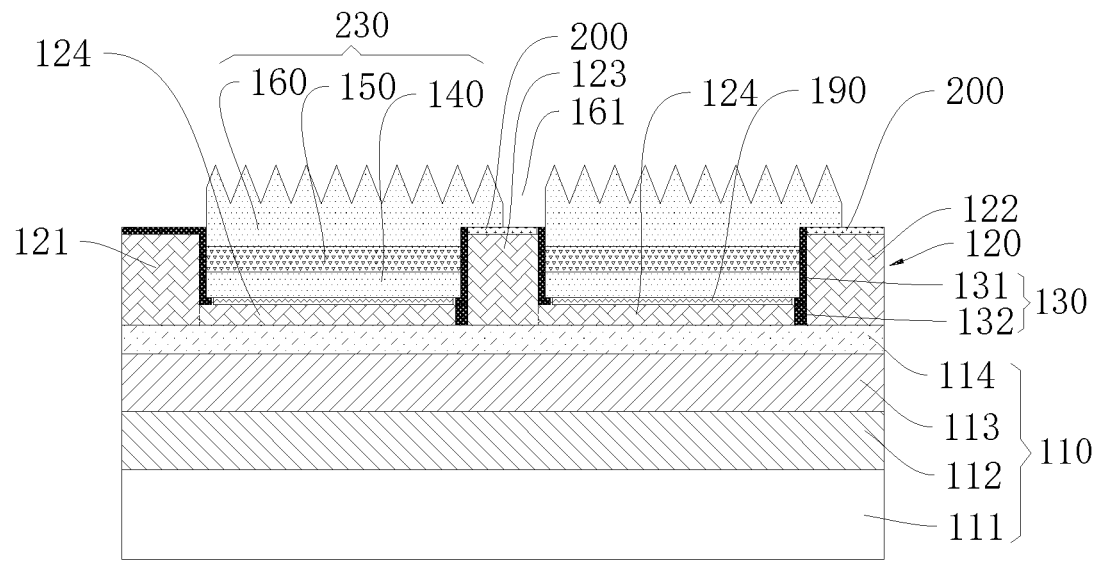

Preferably, a surface of the second semiconductor layer 160 may be roughened or patterned firstly to form a semiconductor light-emitted device 100A as shown in FIG. 34 (taking patterned as an example to illustrate in FIG. 34). The surface of the second semiconductor layer 160 away from the first semiconductor layer 140 is roughened or has a pattern, which may further improve the light extraction rate of the semiconductor light-emitting device 100.

Figure 35:
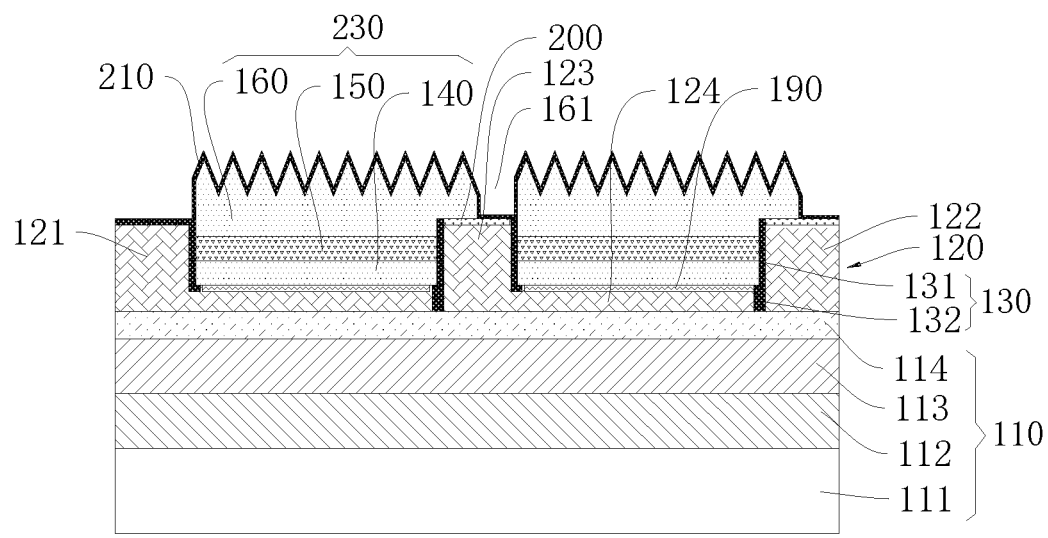

Further, referring to FIG. 35, a passivation layer 210 may be formed on a surface of the second semiconductor layer 160 away from the first semiconductor layer 140, the bottom of the groove 161 and exposed parts of the current diffusion layer 120. The passivation layer 210 may prevent the oxidation of the second semiconductor layer 160 and the current diffusion layer 120, and improve the light extraction rate.

Figure 36:
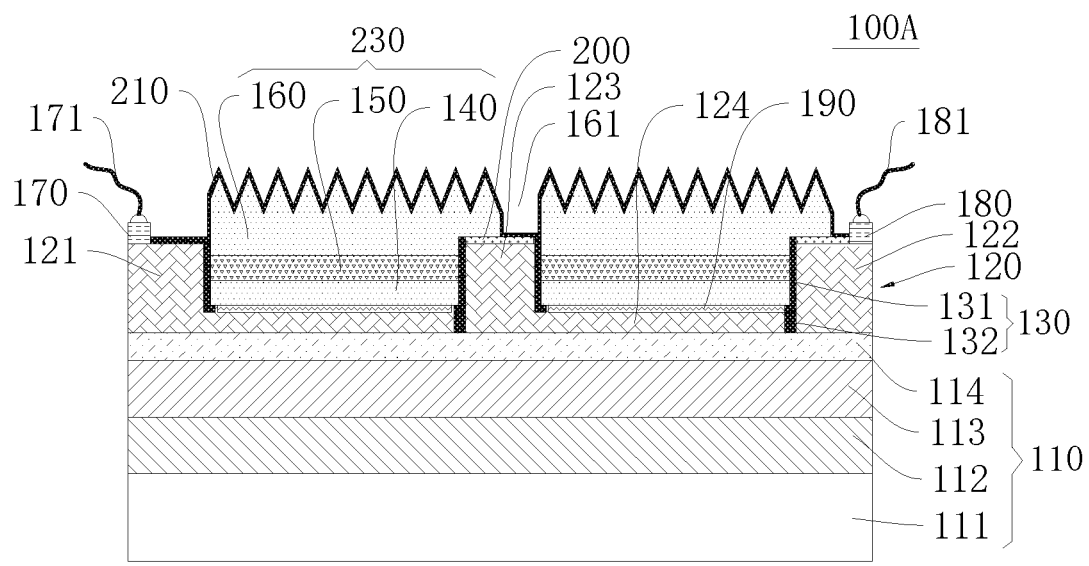

Further, referring to FIG. 36, a part of the insulating layer 131 on the first electrode connecting part 121 may be etched away to form the first electrode 170 connected to the first electrode connecting part 121, a part of the conductive metal layer 200 and the passivation layer 210 on the second electrode connecting part 122 may be etched away to form the second electrode 180 connected to the second electrode connecting part 122, and a specific connection method is not limited herein. In a specific embodiment, the first electrode 170 may be formed on the etched part of the second semiconductor layer 160 corresponding to the first electrode connecting part 121, and the second electrode 180 may be formed on the etched part of the second semiconductor layer 160 corresponding to the second electrode connecting part 122.

Understandably, in other embodiments of the present invention, when the filling grooves 141 are formed, the filling grooves 141 respectively corresponding to the first tunnel electrodes 125 and the second tunnel electrode 126 shown in FIG. 12 are formed. After etching, the second semiconductor layer 160 is exposed by the filling grooves 141. One end of the filling groove 141 corresponding to the first tunnel electrodes 125 is electrically connected to the filling groove 141 corresponding to the contact part 123, and one end of the filling groove 141 corresponding to the second tunnel electrodes 126 is electrically connected to the filling groove 141 corresponding to the contact part 123. A first insulating layer 131 is formed on side walls 142 of each filling groove 141 and the bottom wall 143 of the filling groove 141 corresponding to the first electrode connecting part 121.

Figure 37:
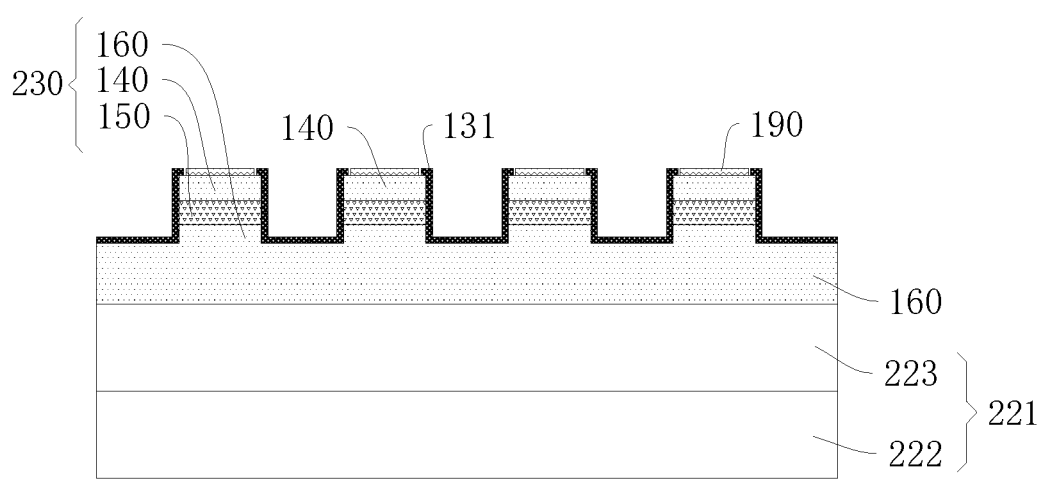
FIGS. 37-38 are schematic diagrams illustrating each component of a semiconductor light-emitting device in each step of a manufacturing method for the semiconductor light-emitting device according to another preferred embodiment of the present invention.

Referring to FIG. 37, when the current diffusion layer 120 is formed, the current diffusion layer 120 is filled in the filling grooves 141 corresponding to the first tunnel electrode 125 and the second tunnel electrode 126. One end of the first tunnel electrode 125 is electrically connected to the contact part 123, and one end of the second tunnel electrode 126 is electrically connected to the second electrode 180.

Figure 38:
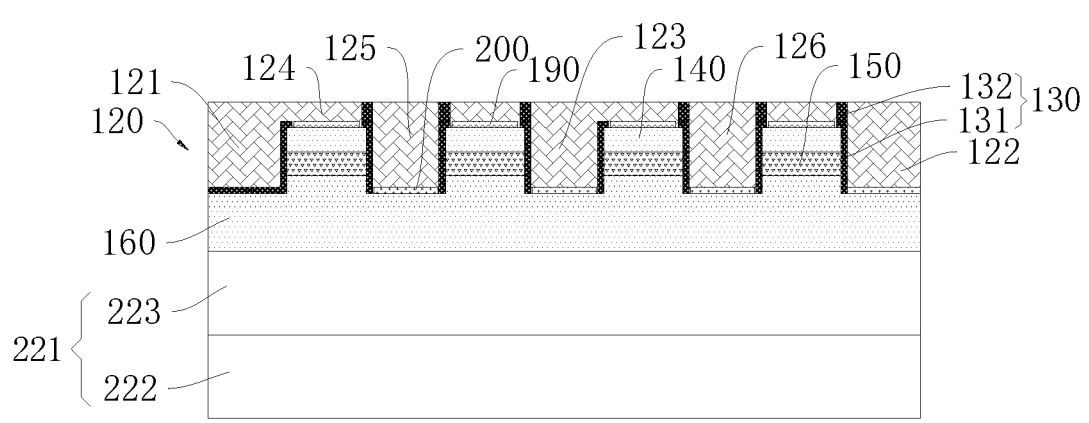

Referring to FIG. 38, when the second insulating layer 132 is formed, the insulating layer 130 is arranged on both sides of the first tunnel electrode 125 and the second tunnel electrode 126. The first tunnel electrode 125 and the second tunnel electrode 126 may help to spread the current, and may use the electrode with a finger-shaped structure. The design of the first tunnel electrode 125 and the second tunnel electrode 126 is flexible, the number of the fingers may be one or more, and not limited herein.

In summary, the semiconductor light-emitting device and the manufacturing method therefor according to embodiments of the present invention are higher in integration density, smaller in size, and have less wiring and higher reliability than a high-voltage LED in which multiple semiconductor light-emitting devices are connected in series and in parallel. Moreover, the first electrode 170 and the second electrode 180 are arranged on the same side, which avoids the problem of increasing the front-end voltage caused by the packaging process of the traditional vertical electrode with the different-side structure.

It should also be noted that, in the description the embodiments of the present invention, the terms "arranged", "install", "connected with" and "connect" should be interpreted broadly unless specifically defined or limited otherwise. For example, "connected" may be a fixed connection, or a detachable connection, or an integrated connection. It may be a mechanical connection or an electrical connection. It may be a direct connection, or an indirect connection via an intermediate media, or an internal connection of two elements. For those skilled in the art, the specific meanings of the above-mentioned terms in the embodiments of present invention may be understood according to specific cases.

It should be noted that similar reference symbols and letters denote similar items in the accompanying drawings, and therefore, once an item is defined in an accompanying drawing, it need not be further defined and interpreted in subsequent accompanying drawings.

In the description of the embodiments of the present invention, it should also be noted that o the terms "center", "up", "down", "left", "right", "vertical", "horizontal", "inner", "outer" and the like indicate the orientation or positional relationship based on the orientation or positional relationship shown in the drawings, or the orientation or positional relationship of the embodiments product when used conventionally. This is merely for convenience of describing the embodiments and simplification of the description, rather than to indicate or imply that the device or component referred to must have a specific orientation, be constructed and operated in a specific orientation, therefore it should not be understood as a limitation of the present invention. In addition, terms "first," "second," "third", etc. are merely used for distinguishing descriptions, and should not be understood as an indication or implication of relative importance.

While the present disclosure has been described with reference to exemplary embodiments, it will be apparent to those skilled in the art that various changes and modifications may be made without departing from the spirit and scope of the present invention. Therefore, the above embodiments are provided for illustrative purposes only, and should not in any sense be interpreted as limiting the scope of the present disclosure.

What is claimed is:

1. A semiconductor light-emitting device, comprising:
an insulating base;
a current diffusion layer arranged on the insulating base, the current diffusion layer comprising: a first electrode connecting part, a second electrode connecting part, N contact parts between the first electrode connecting part and the second electrode connecting part, and N+1 flat parts between the first electrode connecting part and one contact part of the N contact parts which is adjacent to the first electrode connecting part, among the N contact parts, and between the second electrode connecting part and one contact part of the N contact parts which is adjacent to the second electrode connecting part, and N being a natural number;
N+1 light-emitting structure layers correspondingly disposed on the N+1 flat parts, each of the N+1 light-emitting structure layers comprising: a first semiconductor layer, an active layer and a second semiconductor layer sequentially stacked on a corresponding flat part, N grooves cooperating with the N contact parts being formed on a side of the second semiconductor layer away from the active layer, a depth of the N grooves is less than a thickness of the second semiconductor layer, and the N contact parts correspond to the N grooves; and
an insulating layer,
wherein the insulating layer is disposed between the first electrode connecting part and a side of a light-emitting structure layer adjacent to the first electrode connecting part, and the first electrode connecting part is connected to the first semiconductor layer of the light-emitting structure layer disposed on the flat part through a flat part adjacent to the first electrode connecting part; the insulating layer is disposed between the second electrode connecting part and sides of the active layer and the first semiconductor layer of a light-emitting structure layer adjacent to the second electrode connecting part, and a side of a flat part adjacent to the second electrode connecting part, and a part of an end surface of the second electrode connecting part away from the insulating base is connected to the second semiconductor layer of the light-emitting structure layer adjacent to the second electrode connecting part; and the insulating layer is disposed between each of the contact parts and sides of the active layer and the first semiconductor layer of a light-emitting structure layer on a side of a corresponding contact part near the first electrode connecting part, and a side of a flat part on the side of the corresponding contact part near the first electrode connecting part, and between each of the contact parts and a side of a light-emitting structure layer on a side of a corresponding contact part near the second electrode connecting part, and an end surface of each of the contact parts away from the insulating base is connected to the second semiconductor layer of a light-emitting structure layer on a side of a corresponding contact part near the first electrode connecting part, and is connected to the first semiconductor layer on the flat part through a flat part on a side of a corresponding contact part near the second electrode connecting part;
a first electrode formed on the first electrode connecting part and a second electrode formed on the second electrode connecting part, wherein the first electrode and the second electrode are located on a side of the active layer away from the insulating base.

2. The semiconductor light-emitting device of claim 1, wherein the insulating base includes a first substrate, and a first bonding metal layer, a second bonding metal layer and an insulating base layer sequentially stacked on the first substrate, and the insulating base layer is disposed between the second bonding metal layer and the current diffusion layer.

3. The semiconductor light-emitting device according to claim 1, further comprising: a reflective metal layer formed between the first semiconductor layer and the current diffusion layer.

4. The semiconductor light-emitting device of claim 1, further comprising: a conductive metal layer formed on parts connected to the second semiconductor layer of end surfaces of the N contact parts away from the insulating base.

5. The semiconductor light-emitting device of claim 1, wherein a surface of the second semiconductor layer away from the first semiconductor layer has a pattern or a rough surface.

6. The semiconductor light-emitting device of claim 1, further comprising: a passivation layer formed on a surface of the second semiconductor layer away from the first semiconductor layer and bottoms of the N grooves.

7. The semiconductor light-emitting device of claim 1, wherein the current diffusion layer further comprises at least one first tunnel electrode and at least one second tunnel electrode, the at least one first tunnel electrode is located between the first electrode connecting part and a contact part or between two adjacent contact parts, the at least one second tunnel electrode is located between a contact part and the second electrode connecting part, both sides of the at least one first tunnel electrode and the at least one second tunnel electrode are provided with the insulating layer, end surfaces of the at least one first tunnel electrode and the at least one second tunnel electrode near the insulating base are connected to the insulating base, and end surfaces of the at least one first tunnel electrode and the at least one second tunnel electrode away from the insulating base are electrically connected to the second semiconductor layer of corresponding light-emitting structure layers.

8. A manufacturing method for the semiconductor light-emitting device of claim 1, comprising:
providing a semiconductor light-emitting base layer, the semiconductor light-emitting base layer including a first base, and a second semiconductor layer, an active layer and a first semiconductor layer sequentially formed on the first base;
forming filling grooves respectively corresponding to a first electrode connecting part, a second electrode connecting part and N contact parts on a surface of the first semiconductor layer away from the first base, the filling grooves extending from the surface of the first semiconductor layer away from the first base toward the second semiconductor layer, and the second semiconductor layer being exposed to the filling grooves;
forming a first insulating layer on side walls of each of the filling grooves and a bottom wall of a filling groove corresponding to the first electrode connecting part;
forming a current diffusion layer on a surface of the first semiconductor layer away from the second semiconductor layer, the current diffusion layer including the first electrode connecting part, the second electrode connecting part, N contact parts and flat parts connecting the first electrode connecting part, the second electrode connecting part and the N contact parts;
etching the flat parts of the current diffusion layer to form a second insulating layer, the second insulating layer being formed between a flat part connected to the first electrode connecting part and a contact part, and between a flat part connected to a contact part and the second electrode connecting part;
forming an insulating base on a surface of the current diffusion layer away from the second semiconductor layer; and
removing the first base, and forming N grooves on a surface of the second semiconductor layer away from the first semiconductor layer, so that the N contact parts are correspondingly exposed to the N grooves.

9. The manufacturing method of claim 8, before forming a current diffusion layer on a surface of the first semiconductor layer away from the second semiconductor layer, further comprising:
performing a treatment for the first insulating layer to expose the surface of the first semiconductor layer away from the first base by the first insulating layer;
forming a reflective metal layer on parts of the first semiconductor layer exposed by the first insulating layer;
etching the first insulating layer on bottom walls of the filling grooves except a bottom wall of a filling groove corresponding to the first electrode connecting part, and retaining the first insulating layer on the bottom wall of the filling groove corresponding to the first electrode connecting part.

10. The manufacturing method of claim 9, before forming a current diffusion layer on a surface of the first semiconductor layer away from the second semiconductor layer, further comprising:
forming a conductive metal layer on etched parts of the first insulating layer.

11. The manufacturing method of claim 10, after forming N grooves on a surface of the second semiconductor layer away from the first semiconductor layer, further comprising:
roughening or patterning a surface of the second semiconductor layer away from the insulating base.

12. The manufacturing method of claim 11, comprising:
forming a passivation layer on the surface of the second semiconductor layer away from the first semiconductor layer, bottoms of the grooves and exposed parts of the current diffusion layer.

13. The manufacturing method of claim 12, after forming the passivation layer, further comprising:
etching a part of the first insulating layer on the first electrode connecting part to form a first electrode, the first electrode being electrically connected to the first electrode connecting part, and etching a part of the conductive metal layer and the passivation layer on the second electrode connecting part to form a second electrode.

14. A semiconductor light-emitting device, comprising:
an insulating base;
a current diffusion layer arranged on the insulating base, the current diffusion layer comprising: a first electrode connecting part, a second electrode connecting part, N contact parts between the first electrode connecting part and the second electrode connecting part, and N+1 flat parts between the first electrode connecting part and one contact part of the N contact parts which is adjacent to the first electrode connecting part, among the N contact parts, and between the second electrode connecting part and one contact part of the N contact parts which is adjacent to the second electrode connecting part, and N being a natural number;
N+1 light-emitting structure layers correspondingly disposed on the N+1 flat parts, each of the N+1 light-emitting structure layers comprising: a first semiconductor layer, an active layer and a second semiconductor layer sequentially stacked on a corresponding flat part, N grooves cooperating with the N contact parts being formed on a side of the second semiconductor layer away from the active layer, a depth of the N grooves is less than a thickness of the second semiconductor layer, and the N contact parts correspond to the N grooves; and an insulating layer, wherein the insulating layer is disposed between the first electrode connecting part and a side of a light-emitting structure layer adjacent to the first electrode connecting part, and the first electrode connecting part is connected to the first semiconductor layer of the light-emitting structure layer disposed on the flat part through a flat part adjacent to the first electrode connecting part; the insulating layer is disposed between the second electrode connecting part and sides of the active layer and the first semiconductor layer of a light-emitting structure layer adjacent to the second electrode connecting part, and a side of a flat part adjacent to the second electrode connecting part, and a part of an end surface of the second electrode connecting part away from the insulating base is connected to the second semiconductor layer of the light-emitting structure layer adjacent to the second electrode connecting part; and the insulating layer is disposed between each of the contact parts and sides of the active layer and the first semiconductor layer of a light-emitting structure layer on a side of a corresponding contact part near the first electrode connecting part, and a side of a flat part on the side of the corresponding contact part near the first electrode connecting part, and between each of the contact parts and a side of a light-emitting structure layer on a side of a corresponding contact part near the second electrode connecting part, and an end surface of each of the contact parts away from the insulating base is connected to the second semiconductor layer of a light-emitting structure layer on a side of a corresponding contact part near the first electrode connecting part, and is connected to the first semiconductor layer on the flat part through a flat part on a side of a corresponding contact part near the second electrode connecting part, wherein the current diffusion layer further comprises at least one first tunnel electrode and at least one second tunnel electrode, the at least one first tunnel electrode is located between the first electrode connecting part and a contact part or between two adjacent contact parts, the at least one second tunnel electrode is located between a contact part and the second electrode connecting part, both sides of the at least one first tunnel electrode and the at least one second tunnel electrode are provided with the insulating layer, end surfaces of the at least one first tunnel electrode and the at least one second tunnel electrode near the insulating base are connected to the insulating base, and end surfaces of the at least one first tunnel electrode and the at least one second tunnel electrode away from the insulating base are electrically connected to the second semiconductor layer of corresponding light-emitting structure layers.

15. A manufacturing method for a semiconductor light-emitting device, the semiconductor light-emitting device comprising:

an insulating base;

a current diffusion layer arranged on the insulating base, the current diffusion layer comprising: a first electrode connecting part, a second electrode connecting part, N contact parts between the first electrode connecting part and the second electrode connecting part, and N+1 flat parts between the first electrode connecting part and one contact part of the N contact parts which is adjacent to the first electrode connecting part, among the N contact parts, and between the second electrode connecting part and one contact part of the N contact parts which is adjacent to the second electrode connecting part, and N being a natural number;

N+1 light-emitting structure layers correspondingly disposed on the N+1 flat parts, each of the N+1 light-emitting structure layers comprising: a first semiconductor layer, an active layer and a second semiconductor layer sequentially stacked on a corresponding flat part, N grooves cooperating with the N contact parts being formed on a side of the second semiconductor layer away from the active layer, a depth of the N grooves is less than a thickness of the second semiconductor layer, and the N contact parts correspond to the N grooves; and an insulating layer, wherein the insulating layer is disposed between the first electrode connecting part and a side of a light-emitting structure layer adjacent to the first electrode connecting part, and the first electrode connecting part is connected to the first semiconductor layer of the light-emitting structure layer disposed on the flat part through a flat part adjacent to the first electrode connecting part; the insulating layer is disposed between the second electrode connecting part and sides of the active layer and the first semiconductor layer of a light-emitting structure layer adjacent to the second electrode connecting part, and a side of a flat part adjacent to the second electrode connecting part, and a part of an end surface of the second electrode connecting part away from the insulating base is connected to the second semiconductor layer of the light-emitting structure layer adjacent to the second electrode connecting part; and the insulating layer is disposed between each of the contact parts and sides of the active layer and the first semiconductor layer of a light-emitting structure layer on a side of a corresponding contact part near the first electrode connecting part, and a side of a flat part on the side of the corresponding contact part near the first electrode connecting part, and between each of the contact parts and a side of a light-emitting structure layer on a side of a corresponding contact part near the second electrode connecting part, and an end surface of each of the contact parts away from the insulating base is connected to the second semiconductor layer of a light-emitting structure layer on a side of a corresponding contact part near the first electrode connecting part, and is connected to the first semiconductor layer on the flat part through a flat part on a side of a corresponding contact part near the second electrode connecting part;

wherein the manufacturing method comprises:

providing a semiconductor light-emitting base layer, the semiconductor light-emitting base layer including a first base, and a second semiconductor layer, an active layer and a first semiconductor layer sequentially formed on the first base;

forming filling grooves respectively corresponding to a first electrode connecting part, a second electrode connecting part and N contact parts on a surface of the first semiconductor layer away from the first base, the filling grooves extending from the surface of the first semiconductor layer away from the first base toward the second semiconductor layer, and the second semiconductor layer being exposed to the filling grooves;

forming a first insulating layer on side walls of each of the filling grooves and a bottom wall of a filling groove corresponding to the first electrode connecting part;

forming a current diffusion layer on a surface of the first semiconductor layer away from the second semiconductor layer, the current diffusion layer including the first electrode connecting part, the second electrode connecting part, N contact parts and flat parts connecting the first electrode connecting part, the second electrode connecting part and the N contact parts;

etching the flat parts of the current diffusion layer to form a second insulating layer, the second insulating layer being formed between a flat part connected to the first electrode connecting part and a contact part, and between a flat part connected to a contact part and the second electrode connecting part;

forming an insulating base on a surface of the current diffusion layer away from the second semiconductor layer; and removing the first base, and forming N grooves on a surface of the second semiconductor layer away from the first semiconductor layer, so that the N contact parts are correspondingly exposed to the N grooves.

* * * * *